(12) United States Patent
Hartman et al.

(10) Patent No.: US 11,414,777 B2
(45) Date of Patent: Aug. 16, 2022

(54) SYSTEMS AND METHODS FOR CONTINUOUS-FLOW LASER-INDUCED NUCLEATION

(71) Applicant: NEW YORK UNIVERSITY, New York, NY (US)

(72) Inventors: Ryan L. Hartman, New York, NY (US); Bruce Garetz, New York, NY (US); Tianyi Hua, Brooklyn, NY (US); Omar Gowayed, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 16/936,196

(22) Filed: Jul. 22, 2020

(65) Prior Publication Data

US 2021/0025075 A1 Jan. 28, 2021

Related U.S. Application Data

(60) Provisional application No. 62/877,670, filed on Jul. 23, 2019.

(51) Int. Cl.
*C30B 13/24* (2006.01)
*C30B 35/00* (2006.01)
*C30B 13/26* (2006.01)
*C30B 13/00* (2006.01)

(52) U.S. Cl.
CPC .......... *C30B 13/24* (2013.01); *C30B 13/005* (2013.01); *C30B 13/26* (2013.01); *C30B 35/007* (2013.01)

(58) Field of Classification Search
CPC ......... C30B 29/54; C30B 13/24; C30B 13/26; C30B 13/005; C30B 35/007
See application file for complete search history.

(56) References Cited

U.S. PATENT DOCUMENTS

| | | | | |
|---|---|---|---|---|
| 7,122,642 B2* | 10/2006 | Myerson | ............. | B01D 9/0036 530/418 |
| 7,879,115 B2* | 2/2011 | Garetz | .................... | C30B 29/54 23/295 R |
| 9,751,068 B2* | 9/2017 | Mori | .................... | B01D 9/0081 |

(Continued)

OTHER PUBLICATIONS

Adachi, et al., "Laser Irradiated Growth of Protein Crystal," Japanese Journal of Applied Physics 42(2)(7B), pp. L798-L800 (2003).

(Continued)

*Primary Examiner* — Robert M Kunemund
(74) *Attorney, Agent, or Firm* — Foley & Lardner LLP

(57) ABSTRACT

In general, the systems and methods described in this application relate to laser-induced nucleation in continuous flow. A method of laser-induced nucleation in continuous flow includes injecting a saturated solution, undersaturated solution, or supersaturated solution through an inlet of a device. The method can include converting the saturated solution or undersaturated solution into supersaturated solution by changing a temperature of the saturated solution or undersaturated solution. The method can include passing one or more laser pulses through the supersaturated solution within the device. The method can include flowing the saturated solution, undersaturated solution, or the supersaturated solution through an outlet of the device.

18 Claims, 13 Drawing Sheets

(56) References Cited

U.S. PATENT DOCUMENTS

| | | | | |
|---|---|---|---|---|
| 2015/0017762 | A1* | 1/2015 | Yamazaki | H01L 29/7869 438/104 |
| 2015/0165440 | A1* | 6/2015 | Davies | B01L 7/525 435/287.2 |

OTHER PUBLICATIONS

Adamo, et al., "On-demand continuous-flow production of pharmaceuticals in a compact, reconfigurable system," Science 23(6281), pp. 61-67 (2016).

Alexander & Camp, "Non-photochemical laser-induced nucleation," Journal of Chemical Physics 150, 040901, 12 pages (2019).

Alexander & Camp, "Single Pulse, Single Crystal Laser-Induced Nucleation of Potassium Chloride," Crystal Growth & Design 9(2), pp. 958-963 (2009).

Arlin, et al., "A strategy for producing predicted polymorphs: catemeric carbamazepine form V," Chemical Communications 47, pp. 7074-7076 (2011).

Bochmann, et al., "Synthesis of Base-Free Cationic Zirconium Methyl and Benzyl Complexes. The Crystal and Molecular Structure of {C5H3(SiMe3)2-1,3}2ZrMe(.mu.-Me)B(C6F5)3," Organometallics 13(6), pp. 2235-2243 (1994).

Bonnin-Paris, et al., "Determination of the metastable zone width of glycine aqueous solutions for batch crystallizations," Chemical Engineering Communications 198(8), pp. 1004-1017 (2011).

Calabrese & Pissavini, "From batch to continuous flow processing in chemicals manufacturing," AIChE Journal 57(4), pp. 828-834 (2011).

Cambie, et al., "Applications of Continuous-Flow Photochemistry in Organic Synthesis, Material Science, and Water Treatment," Chemical Reviews 116(17), pp. 10276-10341 (2016).

Cano, et al., "Experimental study on the ibuprofen crystal growth morphology in solution," Journal of Crystal Growth 224(3-4), pp. 335-341 (2001).

Chan & Nascimento, "Use of neural networks for modeling of olefin polymerization in high pressure tubular reactors," Journal of Applied Polymer Science 53(10), pp. 1277-1289 (1994).

Chen & Hartman, "Methane hydrate intrinsic dissociation kinetics measured in a microfluidic system by means of in-situ Raman spectroscopy," Energy Fuels 32(11), pp. 11761-11771 (2018).

Chen & Marks, "Cocatalysts for Metal-Catalyzed Olefin Polymerization:? Activators, Activation Processes, and Structure-Activity Relationships," Chemical Reviews 100(4), pp. 1391-1434 (2000).

Chen, et al., "Flash crystallization kinetics of methane (sI) hydrate in a thermoelectrically-cooled microreactor," Lab on a Chip 17, pp. 3051-3060 (2017).

Chen, et al., "Pharmaceutical Crystallization," Crystal Growth & Design 11(4), pp. 887-895 (2011).

Chen, et al., "Using microfluidics to observe the effect of mixing on nucleation of protein crystals," Journal of the American Chemical Society 127(27), pp. 9672-9673 (2005).

Chen, et al., "When Solids Stop Flow Chemistry in Commercial Tubing," Journal of Flow Chemistry 5(3), pp. 166-171 (2015).

Chetouani, "Using Artificial Neural networks for the modelling of a distillation column," International Journal of Computer Science & Applications 4(3), pp. 119-133 (2007).

Christopher, et al., "Synthesis, Structure, and Reactivity of rac-Me2Si(indenyl)2Zr(NMe2)2," Organometallics 15(19), pp. 4038-4044 (1996).

Clair, et al., "A new experimental setup for high-throughput controlled non-photochemical laser-induced nucleation: application to glycine crystallization," Journal of Applied Crystallography 47, pp. 1252-1260 (2014).

Coyle & Oelgemoller, "Micro-photochemistry: photochemistry in microstructured reactors. The new photochemistry of the future?," Photochemical & Photobiological Sciences 7, pp. 1313-1322 (2008).

Curteanu, et al., "Artificial intelligence modelling methodologies applied to a polymerization process," 4th International Conference On Simulation And Modeling Methodologies, Technologies And Applications, pp. 43-49 (2014).

Czernicki & Baranska, "Carbamazepine polymorphs: Theoretical and experimental vibrational spectroscopy studies," Vibrational Spectroscopy 65, pp. 12-23 (2013).

Di Martino, et al., "Influence of crystal habit on the compression and densification mechanism of ibuprofen," Journal of Crystal Growth 243(2), pp. 345-355 (2002).

Domier & Hartman, "Chemical reaction engineering perspectives on the role of water in fine chemicals and pharmaceuticals manufacture," Chimica Oggi—Chemistry Today 32(4), pp. 36-41 (2014).

Duffus, et al., "Spatial Control of Crystal Nucleation in Agarose Gel," Journal of the American Chemical Society 131(33), pp. 11676-11677 (2009).

Emamzadah, et al., "Cyclic olefin homopolymer-based microfluidics for protein crystallization and in situ X-ray diffraction," Acta Crystallographica Section D: Biological Crystallography 65(9), pp. 913-920 (2009).

Fang, et al., "Nonphotochemical Laser-Induced Nucleation in Levitated Supersaturated Aqueous Potassium Chloride Microdroplets," Crystal Growth 14(5), pp. 2685-2688 (2014).

Feng, et al., "Microfluidics-mediated assembly of functional nanoparticles for cancer-related pharmaceutical applications," Nanoscale 8, pp. 12430-12443 (2016).

Ferreira, et al., "Protein crystallization in a droplet-based microfluidic device: Hydrodynamic analysis and study of the phase behavior," Chemical Engineering Science 191, pp. 232-244 (2018).

Frenz, et al., "Droplet-Based Microreactors for the Synthesis of Magnetic Iron Oxide Nanoparticles," Angewandte Chemie 47(36), pp. 6817-6820 (2008).

Ganan-Calvo, et al., "Building functional materials for health care and pharmacy from microfluidic principles and Flow Focusing," Advanced Drug Delivery Reviews 65(11-12), pp. 1447-1469 (2013).

Garekani, et al., "Crystal Habit Modifications of Ibuprofen and Their Physicomechanical Characteristics," Drug Development and Industrial Pharmacy 27(8), pp. 803-809 (2001).

Garetz, et al., "Nonphotochemical, Polarization-Dependent, Laser-Induced Nucleation in Supersaturated Aqueous Urea Solutions," Physical Review Letters 77(16), pp. 3475-3476 (1996).

Garetz, et al., "Polarization Switching of Crystal Structure in the Nonphotochemical Light-Induced Nucleation of Supersaturated Aqueous Glycine Solutions," Physical Review Letters 89, 175501, 4 pages (2002).

Gicquel, et al., "Microfluidic Chips for In Situ Crystal X-ray Diffraction and In Situ Dynamic Light Scattering for Serial Crystallography," Journal of Visualized Experiments 134, e57133, 14 pages (2018).

Grzesiak, et al., "Comparison of the Four Anhydrous Polymorphs of Carbamazepine and the Crystal Structure of Form I," Journal of Pharmaceutical Sciences 92(11), pp. 2260-2271 (2003).

Gunther & Jensen, "Multiphase microfluidics: from flow characteristics to chemical and materials synthesis," Lab on a Chip 6, pp. 1487-1503 (2006).

Gunther, et al., "Micromixing of miscible liquids in segmented gas-liquid flow," Langmuir 21(4), pp. 1547-1555 (2005).

Harris, et al., "Structural Studies of the Polymorphs of Carbamazepine, Its Dihydrate, and Two Solvates," Organic Process Research & Development 9(6), pp. 902-910 (2005).

Hartman & Jensen, "Microchemical Systems for Continuous-Flow Synthesis," Lab on a Chip 9, pp. 2495-2507 (2009).

Hartman, "Managing Solids in Microreactors for the Upstream Continuous Processing of Fine Chemicals," Organic Process Research & Development 16(5), pp. 870-887 (2012).

Hartman, et al., "Deciding Whether To Go with the Flow: Evaluating the Merits of Flow Reactors for Synthesis," Angewandte Chemie 50(33), pp. 7502-7519 (2011).

Hartman, et al., "Distillation in microchemical systems using capillary forces and segmented flow," Lab on a Chip 9, pp. 1843-1849 (2009).

(56) References Cited

OTHER PUBLICATIONS

Hartman, et al., "Multistep Microchemical Synthesis Enabled by Microfluidic Distillation," Angewandte Chemie 122, pp. 911-915 (2010).
Hartman, et al., "Overcoming the Challenges of Solid Bridging and Constriction during Pd-Catalyzed C—N Bond Formation in Microreactors," Organic Process Research & Development 14(6), pp. 1347-1357 (2010).
Herrmann, et al., "The First Example of an Ethylene-Selective Soluble Ziegler Catalyst of the Zirconocene Class," Angewandte Chemie 28(11), pp. 1511-1512 (1989).
Hilfiker, et al., "Polymorphism—integrated approach from high-throughput screening to crystallization optimization," Journal of Thermal Analysis and Calorimetry 73(2), pp. 429-440 (2003).
Himmelblau, "Applications of artificial neural networks in chemical engineering," Korean Journal of Chemical Engineering 17(4), pp. 373-392 (2000).
Hosokawa, et al., "Femtosecond Laser-Induced Crystallization of 4-(Dimethylamino)-N-methyl-4-stilbazolium Tosylate," Crystal Growth & Design 5(3), pp. 861-863 (2005).
Hu & Hartman, "High-throughput packed-bed microreactors with in-line analytics for the discovery of asphaltene deposition mechanisms," AIChE Journal 60(10), pp. 3534-3546 (2014).
Hu, et al., "Development of an automated multi-stage continuous reactive crystallization system with in-line PATs for high viscosity process," Reaction Chemistry & Engineering 3, pp. 658-667 (2018).
Hu, et al., "Microfluidic investigation of the deposition of asphaltenes in porous media," Lab on a Chip 14, pp. 2014-2022 (2014).
Hu, et al., "Packed-bed microreactors for understanding of the dissolution kinetics and mechanisms of asphaltenes in xylenes," Chemical Engineering Science 140, pp. 144-152 (2016).
Hu, et al., "Role of Water on the Precipitation and Deposition of Asphaltenes in Packed-Bed Microreactors," Industrial & Engineering Chemistry Research 54(16), pp. 4103-4112 (2015).
Hung, et al., "Alternating droplet generation and controlled dynamic droplet fusion in microfluidic device for CdS nanoparticle synthesis," Lab on a Chip 6, pp. 174-178 (2006).
Hutley & Oueredni, "Polyolefins—The History and Economic Impact," Polyolefin Compounds and Materials, pp. 13-50 (2015).
Ibrehem, et al., "Mathematical Model and Advanced Control for Gas-phase Olefin Polymerization in Fluidized-bed Catalytic Reactors," Chinese Journal of Chemical Engineering 16(1), pp. 84-89 (2008).
Ikni, et al., "Experimental Demonstration of the Carbamazepine Crystallization from Non-photochemical Laser-Induced Nucleation in Acetonitrile and Methanol," Crystal Growth & Design 14(7), pp. 3286-3299 (2014).
Inkson, et al., "Monte Carlo Simulation for the Structure of Polyolefins Made with Two Metallocene Catalysts in a Batch Reactor," Macromolecules 39(14), pp. 4920-4931 (2006).
Jacob, et al., "Homogeneous Nucleation-Growth Dynamics Induced by Single Laser Pulse in Supersaturated Solutions," Crystal Growth & Design 12(12), pp. 5980-5985 (2012).
Javid, et al., "Filtration Suppresses Laser-Induced Nucleation of Glycine in Aqueous Solutions," Crystal Growth & Design 16(8), pp. 4196-4202 (2016).
Kachrimanis, et al., "Spherical Crystal Agglomeration of Ibuprofen by the Solvent-Change Technique in Presence of Methacrylic Polymers," Journal of Pharmaceutical Sciences 89(2), pp. 250-259 (2000).
Kacker, et al., "Multiparameter Investigation of Laser-Induced Nucleation of Supersaturated Aqueous KCl Solutions," Crystal Growth & Design 18(1), pp. 312-317 (2018).
Kaminsky & Renner, "High melting polypropenes by silica-supported zirconocene catalysts," Macromolecular Rapid Communictions 14, pp. 293-243 (1993).
Kaminsky & Steiger, "Polymerization of olefins with homogeneous zirconocene/alumoxane catalysts," Polyhedron 7(22-23), pp. 2375-2381 (1988).

Kaminsky, et al., "Polymerization of Propene and Butene with a Chiral Zirconocene and Methylalumoxane as Cocatalyst," Angewandte Chemie 24(6), pp. 507-508 (1985).
Kawamura-Kuribayashi, et al., "An ab initio MO and MM study of homogeneous olefin polymerization with silylene-bridged zirconocene catalyst and its regio- and stereoselectivity," Journal of the American Chemical Society 114(22), pp. 8687-8694 (1992).
Kim & Hwang, "Isospecific Polymerization of Propylene By ansa-Zirconocene Diamide Compound Cocatalyzed by Mao," Journal of Macromolecular Science, Part A: Pure and Applied Chemistry 35(12), pp. 1987-2008 (1998).
Kito, et al., "Estimation of catalytic performance by neural network—product distribution in oxidative dehydrogenation of ethylbenzene," Applied Catalysis A: General 114(2), pp. L173-L178 (1994).
Knott, et al., "A simulation test of the optical Kerr mechanism for laser-induced nucleation," The Journal of Chemical Physics 134, 154501, 7 pages (2011).
Knott, et al., "Communication: Bubbles, crystals, and laser-induced nucleation," Journal of Chemical Physics 134, 171102, 4 pages (2011).
Kuhn, et al., "Teflon-Coated Silicon Microreactors: Impact on Segmented Liquid-Liquid Multiphase Flows," Langmuir 27(10), pp. 6519-6527 (2011).
Lang, et al., "Form IV of Carbamazepine," Journal of Pharmaceutical Sciences 91(4), pp. 1186-1190 (2002).
Lee, et al., "Nonphotochemical Laser Induced Nucleation of Hen Egg White Lysozyme Crystals," Crystal Growth & Design 8(12), pp. 4255-4261 (2008).
Li & Ismagilov, "Protein Crystallization Using Microfluidic Technologies Based on Valves, Droplets, and SlipChip," Annual Review of Biophysics 39, pp. 139-158 (2010).
Li, et al., "Application of Artificial Neural Networks for Catalysis: A Review," Catalysts 7(10), 306, 19 pages (2017).
Li, et al., "Non-Photochemical Laser-Induced Nucleation of Sulfathiazole in a Water/Ethanol Mixture," Crystal Growth & Design 16(5), pp. 2514-2526 (2016).
Liu, et al., "Polarization independence of laser-induced nucleation in supersaturated aqueous urea solutions," Physical Chemistry Chemical Physics 19, pp. 3464-3467 (2017).
Liu, et al., "Single femtosecond laser pulse-single crystal formation of glycine at the solution surface," Journal of Crystal Growth 366, pp. 101-106 (2013).
Liu, et al., "Supersaturation dependence of glycine polymorphism using laser-induced nucleation, sonocrystallization and nucleation by mechanical shock," Physical Chemistry Chemical Physics 19, pp. 19386-19392 (2017).
Loo, et al., "Phase Behavior of Mixtures of Block Copolymers and a Lithium Salt," The Journal of Physical Chemistry B 122(33), pp. 8065-8074 (2018).
Lu, et al., "Photochemical reactions and on-line UV detection in microfabricated reactors," Lab on a Chip 1, pp. 22-28 (2001).
Manic & Sabharwall, "Computational Intelligence as a Tool for Small Modular Reactors," ASME 2011 Small Modular Reactors Symposium, pp. 299-310 (2011).
Marre & Jensen, "Synthesis of Micro and Nanostructures in Microfluidic Systems," Chemical Society Reviews 39, pp. 1183-1202 (2010).
Matic, et al., "Intensity, Wavelength, and Polarization Dependence of Nonphotochemical Laser-Induced Nucleation in Supersaturated Aqueous Urea Solutions," Crystal Growth & Design 5(4), pp. 1565-1567 (2005).
Mersmann, "Calculation of interfacial tensions," Journal of Crystal Growth 102(4), pp. 841-847 (1990).
Nguyen, et al., "Precision measurement of the growth rate and mechanism of ibuprofen {001} and {011} as a function of crystallization environment," CrystEngComm 16, pp. 4568-4586 (2014).
Noel, et al., "Palladium-catalyzed amination reactions in flow: overcoming the challenges of clogging via acoustic irradiation," Chemical Science 2, pp. 287-290 (2011).
Parambil, et al., "Establishing template-induced polymorphic domains for API crystallisation: the case of carbamazepine," CrystEngComm 17, pp. 6384-6392 (2015).

(56) References Cited

OTHER PUBLICATIONS

Parkale, "Comparison of ANN Controller and PID Controller for Industrial Water Bath Temperature Control System using MATLAB Environment," International Journal of Computer Applications 53(2), 6 pages (2012).

Pham, et al., "Coupling High Throughput Microfluidics and Small-Angle X-ray Scattering to Study Protein Crystallization from Solution," Analytical Chemistry 89(4), pp. 2282-2287 (2017).

Pinho & Hartman, "Microfluidics with in situ Raman spectroscopy for the characterization of non-polar/aqueous interfaces," Reaction Chemistry & Engineering 2, pp. 189-200 (2017).

Pinho, et al., "Confined methane-water interfacial layers and thickness measurements using in situ Raman spectroscopy," Lab on a Chip 17, pp. 3883-3890 (2017).

Pinho, et al., "Role of HZSM-5 Aluminosilicates on Asphaltenes Deposition by High-throughput in Situ Characterizations of a Microreservoir," Energy Fuels 31(11), pp. 11640-11650 (2017).

Porter, et al., "Polymorphism in Carbamazepine Cocrystals," Crystal Growth & Design 8(1), pp. 14-16 (2008).

Psaltis, et al., "A multilayered neural network controller," IEEE Control Systems Magazine 8(2), pp. 17-21 (1988).

Rasenack & Muller, "Ibuprofen crystals with optimized properties," International Journal of Pharmaceutics 245(1-2), pp. 9-24 (2002).

Rasenack & Muller, "Properties of Ibuprofen Crystallized Under Various Conditions: A Comparative Study," Drug Development and Industrial Pharmacy 28(9), pp. 1077-1089 (2002).

Rieger & Janiak, "Concentration effects of methylalumoxane, zirconocene dichloride and trimethylaluminum in ethylene polymerization," Macromolecular Materials and Engineering 215(1), pp. 35-46 (1994).

Rizkin & Hartman, "Catalytic activity of Pd/hydrophilic phosphine ligand in the interface of an aqueous-phase Cu-free Sonogashira coupling," Reaction Chemistry & Engineering 3, pp. 251-257 (2018).

Rizkin, et al., "Artificial Neural Network control of thermoelectrically-cooled microfluidics using computer vision based on IR thermography," Computers and Chemical Engineering 121, pp. 584-593 (2019).

Rungsimanon, et al., "Crystallization in Unsaturated Glycine/D2O Solution Achieved by Irradiating a Focused Continuous Wave Near Infrared Laser," Crystal Growth & Design 10(11), pp. 4686-4688 (2010).

Sadiku, et al., "Artificial Intelligence in Chemical Industry," International Journal of Advanced Research in Science, Engineering and Technology 4(10), pp. 4618-4620 (2017).

Santos, et al., "Application of Artificial Neural Networks in an Experimental Batch Reactor of Styrene Polimerization for Predictive Model Development," Chemical Engineering Transactions 32, pp. 1399-1404 (2012).

Sasaki, et al., "Application of a neural network to the analysis of catalytic reactions Analysis of NO decomposition over Cu/ZSM-5 zeolite," Applied Catalysis A: General 132(2), pp. 261-270 (1995).

Schwaller, et al., "'Found in Translation': predicting outcomes of complex organic chemistry reactions using neural sequence-to-sequence models," Chemical Science 8, pp. 6091-6098 (2018).

Sear, "Nucleation: theory and applications to protein solutions and colloidal suspensions," Journal of Physics: Condensed Matter 19(3), 033101, 28 pages (2007).

Shearman & Menzies, "The Solubilities of Potassium Chloride in Deuterium Water and in Ordinary Water from 0 to 180," Journal of the American Chemical Society 59, pp. 185-186 (1937).

Shi, et al., "Progress of crystallization in microfluidic devices," Lab on a Chip 17, pp. 2167-2185 (2017).

Soare, et al., "Crystal Nucleation by Laser-Induced Cavitation," Crystal Growth & Design 11(6), pp. 2311-2316 (2011).

Soga & Kaminaka, "Polymerization of propene with zirconocene-containing supported catalysts activated by common trialkylaluminiums," Macromolecular Chemistry and Physics 194(6), pp. 1745-1755 (1993).

Song & Ismagilov, "Millisecond kinetics on a microfluidic chip using nanoliters of reagents," Journal of the American Chemical Society 125(47), pp. 14613-14619 (2003).

Song, et al., "Reactions in Droplets in Microfluidic Channels," Angewandte Chemie: Microfluidics, pp. 7336-7356 (2018).

Song, et al., "Zirconocene-catalysed propene polymerisation: kinetics, mechanism, and the role of the anion," Macromolecular Symposia 213(1), pp. 173-186 (2004).

Song, et al., "Zirconocene-Catalyzed Propene Polymerization:? A Quenched-Flow Kinetic Study," Journal of the American Chemical Society 125(25), pp. 7641-7653 (2003).

Su, et al., "Photochemical Transformations Accelerated in Continuous-Flow Reactors: Basic Concepts and Applications," Chemistry: A European Journal 20(34), pp. 10562-10589 (2014).

Sugiura, et al., "Size control of calcium alginate beads containing living cells using micro-nozzle array," Biomaterials 26(16), pp. 3327-3331 (2005).

Sugiyama, et al., "Crystallization of Glycine by Photon Pressure of a Focused CW Laser Beam," Chemistry Letters 36(12), pp. 1480-1481 (2007).

Sun, et al., "Nonphotochemical laser-induced nucleation of nematic phase and alignment of nematic director from a supercooled thermotropic liquid crystal," Physical Review E 79, 021701, 6 pages (2009).

Sun, et al., "Polarization Switching of Crystal Structure in the Nonphotochemical Laser-Induced Nucleation of Supersaturated Aqueous l-Histidine," Crystal Growth & Design 8(5), pp. 1720-1722 (2008).

Sun, et al., "Supersaturation and Polarization Dependence of Polymorph Control in the Nonphotochemical Laser-Induced Nucleation (NPLIN) of Aqueous Glycine Solutions," Crystal Growth & Design 6(3), pp. 684-689 (2006).

Tam, et al., "Particle Formation by Resonant Laser Light in Alkali-Metal Vapor," Physical Review Letters 35(24), pp. 1630-1633 (1975).

Tasnim, et al., "Dendritic Growth of Glycine from Nonphotochemical Laser-Induced Nucleation of Supersaturated Aqueous Solutions in Agarose Gels," Crystal Growth & Design 18(10), pp. 5927-5933 (2018).

Teychene & Biscans, "Microfluidic Device for the Crystallization of Organic Molecules in Organic Solvents," Crystal Growth & Design 11(11), pp. 4810-4818 (2011).

Tyndall, "IX. On a new series of chemical reactions produced by light," Proceedings of the Royal Society of London 17, pp. 92-102 (1869).

Wang, et al., "Characterization of a Block Copolymer with a Wide Distribution of Grain Sizes," Macromolecules 49(21), pp. 8198-8208 (2016).

Wang, et al., "Depolarized Scattering from Block Copolymer Grains Using Circularly Polarized Light," Macromolecules 50(13), pp. 5122-5131 (2017).

Ward & Alexander, "Nonphotochemical Laser-Induced Nucleation of Potassium Halides: Effects of Wavelength and Temperature," Crystal Growth & Design 12(9), pp. 4554-4561 (2012).

Ward, et al., "Laser-Induced Nucleation of Carbon Dioxide Bubbles," Journal of Chemical Physics 142, 144501, 8 pages (2015).

Ward, et al., "Nanosecond pulse width dependence of nonphotochemical laser-induced nucleation of potassium chloride," Chemical Physics Letters 481(1-3), pp. 25-28 (2009).

Ward, et al., "Nonphotochemical Laser-Induced Crystal Nucleation by an Evanescent Wave," Crystal Growth & Design 15(9), pp. 4600-4605 (2015).

Ward, et al., "Non-photochemical laser-induced nucleation of supercooled glacial acetic acid," Physical Chemistry Chemical Physics 14, pp. 90-93 (2012).

Ward, et al., "Role of Impurity Nanoparticles in Laser-Induced Nucleation of Ammonium Chloride," Crystal Growth & Design 16(12), pp. 6790-6796 (2016).

Wen, et al., "Photoinduced Nucleation of Water Vapor," Science 200(4343), pp. 769-771 (1978).

Wu, et al., "Development of an Automated Continuous Clarification Bypass System To Remove Suspended Particulate Matter," Organic Process Research & Development 22(9), pp. 1214-1221 (2018).

(56) References Cited

OTHER PUBLICATIONS

Xue & Ray, "Cell Detection with Deep Convolutional Neural Network and Compressed Sensing," Computing Science, University of Alberta, 28 pages (2018).
Yasin, et al., "Effect of temperature on the isospecific propylene polymerization catalyzed by rac-dimethylsilylbis(2,4,6-trimethyl-1-indenyl)zirconium dichloride/methyl aluminoxane," Polyhedron 24(11), pp. 1262-1268 (2005).
Yen, et al., "A Microfabricated Gas-Liquid Segmented Flow Reactor for High-Temperature Synthesis: The Case of CdSe Quantum Dots," Angewandte Chemie 44(34), pp. 5447-5451 (2005).
Yuyama, et al., "Selective Fabrication of a- and ?-Polymorphs of Glycine by Intense Polarized Continuous Wave Laser Beams," Crystal Growth & Design 12(5), pp. 2427-2434 (2012).
Zaccaro, et al., "Nonphotochemical, Laser-Induced Nucleation of Supersaturated Aqueous Glycine Produces Unexpected ?-Polymorph," Crystal Growth & Design 1(1), pp. 5-8 (2001).
Zeng, et al., "Formation of Amorphous Calcium Carbonate and Its Transformation Mechanism to Crystalline CaCQ3 in Laminar Microfluidics," Crystal Growth & Design 18(3), pp. 1710-1721 (2018).
Zhang, et al., "Artificial neural network-genetic algorithm based optimization for the immobilization of cellulase on the smart polymer Eudragit L-100," Bioresource Technology 101(9), pp. 3153-3518 (2010).
Zheng, et al., "A Droplet-Based, Composite PDMS/Glass Capillary Microfluidic System for Evaluating Protein Crystallization Conditions by Microbatch and Vapor-Diffusion Methods with On-Chip X-Ray Diffraction," Angewandte Chemie 43(19), pp. 2508-2511 (2004).
Zheng, et al., "Screening of protein crystallization conditions on a microfluidic chip using nanoliter-size droplets," Journal of the American Chemical Society 125(37), pp. 11170-11171 (2003).

* cited by examiner

SYSTEMS AND METHODS FOR CONTINUOUS-FLOW LASER-INDUCED NUCLEATION

CROSS-REFERENCE TO RELATED APPLICATIONS

The present application claims the benefit of and priority to U.S. Provisional Patent Application 62/877,670 filed Jul. 23, 2019, which is incorporated by reference herein in its entirety.

GOVERNMENT RIGHTS

This invention was made with government support under grant no. DMR-1420073 awarded by the National Science Foundation. The government has certain rights in the invention.

TECHNICAL FIELD

The present disclosure generally relates to the field of crystallization, and more specifically, to systems and methods for laser-induced nucleation.

BACKGROUND

Crystallization has been used in science and commerce as an efficient method of concentrating and purifying chemicals. Nonphotochemical laser-induced nucleation (NPLIN) is a type of nucleation method in which nucleation is achieved by the action of light on matter. NPLIN has been observed in various aqueous solutions, including urea, glycine, simple salts such as alkali halides, and proteins. The NPLIN of carbon dioxide bubbles from carbonated water has also been observed.

Three mechanisms have been proposed to account for NPLIN. In the optical Kerr effect mechanism, the applied optical electric field induces the alignment of solute molecules in disordered solute clusters, lowering the barrier to nucleation. In the dielectric polarization (DP) model, the applied electric field lowers the energy of slightly subcritical solute clusters, such that they become critical and nucleate. In the colloidal impurity heating mechanism, nanoscale solvent vapor bubbles are formed from the heat generated when impurity particles absorb incident laser light. These bubbles act as sites for heterogeneous nucleation. However, the underlying mechanism remains an open question as any one of the proposed mechanisms explains only part of the reported experimental observations. A need exists for improved technology capable of characterizing crystallization of matter using nonphotochemical laser-induced nucleation.

SUMMARY

The systems and methods described in this application relate to laser-induced nucleation in continuous flow. In conjunction with an optical field, millifluidic laser-induced nucleation can provide for a controlled nucleation process of useful products such as pharmaceuticals, drug polymorphs, and crystalline compounds. The properties of these products can be controlled and tailored through the controlled nucleation process.

The systems and methods described in this application relate to laser-induced nucleation in continuous flow. One aspect of the present disclosure is directed to a method of laser-induced nucleation in continuous flow and can include injecting at least one of a saturated solution, an undersaturated solution, or a supersaturated solution through an inlet of a device. The method can include converting the saturated solution or undersaturated solution into supersaturated solution by changing a temperature of the saturated or undersaturated solution. The method can include passing one or more laser pulses through the supersaturated solution within the device. The method can include flowing at least one of the saturated solution or the supersaturated solution or the undersaturated solution through an outlet of the device.

In some embodiments, the method includes nucleating crystals, responsive to passing the one or more laser pulses through the supersaturated solution within the device, from the supersaturated solution. The method includes collecting the crystals from the device. In some embodiments, the method includes contacting the device with a thermoelectric cooler. In some embodiments, the method includes characterizing, in situ, at least one of crystal size, shape, growth rate, number of crystals, polydispersity, or polymorphism. In some embodiments, the method includes passing the least one of the saturated solution, undersaturated solution, or supersaturated solution through a filter. In some embodiments, the method includes operating the device at a temperature above 0 K. In some embodiments, the method includes operating the device at a pressure below, above, or at 1 bar. In some embodiments, the method includes nucleating crystals from the supersaturated solution resulting from a chemical reaction such as the Heck Reaction, Suzuki Reaction, or Buchwald-Hartwig amination, or any chemical reaction carried out under conditions that result in the formation of supersaturated solution containing crystalline products or byproducts. The method includes selectively inducing nucleation in the bulk flow instead of on equipment or catalyst surfaces, thus improving solids handling.

One aspect of the present disclosure is directed to a method of laser-induced nucleation in continuous flow. The method includes providing a device. The method includes injecting a fluid through an inlet of the device. The method includes passing one or more laser pulses through the flowing fluid within the device. The method includes flowing the fluid through an outlet of the device.

In some embodiments, the flowing fluid is a single phase flow. In some embodiments, the flowing fluid is a multiphase flow. In some embodiments, the method includes nucleating crystals, responsive to passing the one or more laser pulses through the flowing fluid within the device, from a supersaturated solution. The method includes collecting the crystals from the device. In some embodiments, the method includes contacting the device with a thermoelectric cooler. In some embodiments, the method includes characterizing, in situ, at least one of crystal size, shape, growth rate, number of crystals, polydispersity, or polymorphism. In some embodiments, the method includes passing the least one of a saturated solution, undersaturated solution, or supersaturated solution through a filter. In some embodiments, the method includes operating the device at a temperature above 0 K. In some embodiments, the method includes operating the device at a pressure below, above, or at 1 bar. In some embodiments, the method includes nucleating crystals from a supersaturated solution resulting from a chemical reaction such as the Heck Reaction, Suzuki Reaction, or Buchwald-Hartwig amination, or any chemical reaction carried out under conditions that result in the formation of crystalline products or byproducts. In some embodiments, the method includes inducing nucleation in bulk flow instead of on equipment or catalyst surfaces.

BRIEF DESCRIPTION OF THE FIGURES

The foregoing and other objects, aspects, features, and advantages of the disclosure will become more apparent and better understood by referring to the following description taken in conjunction with the accompanying drawings, in which.

Figure 1:
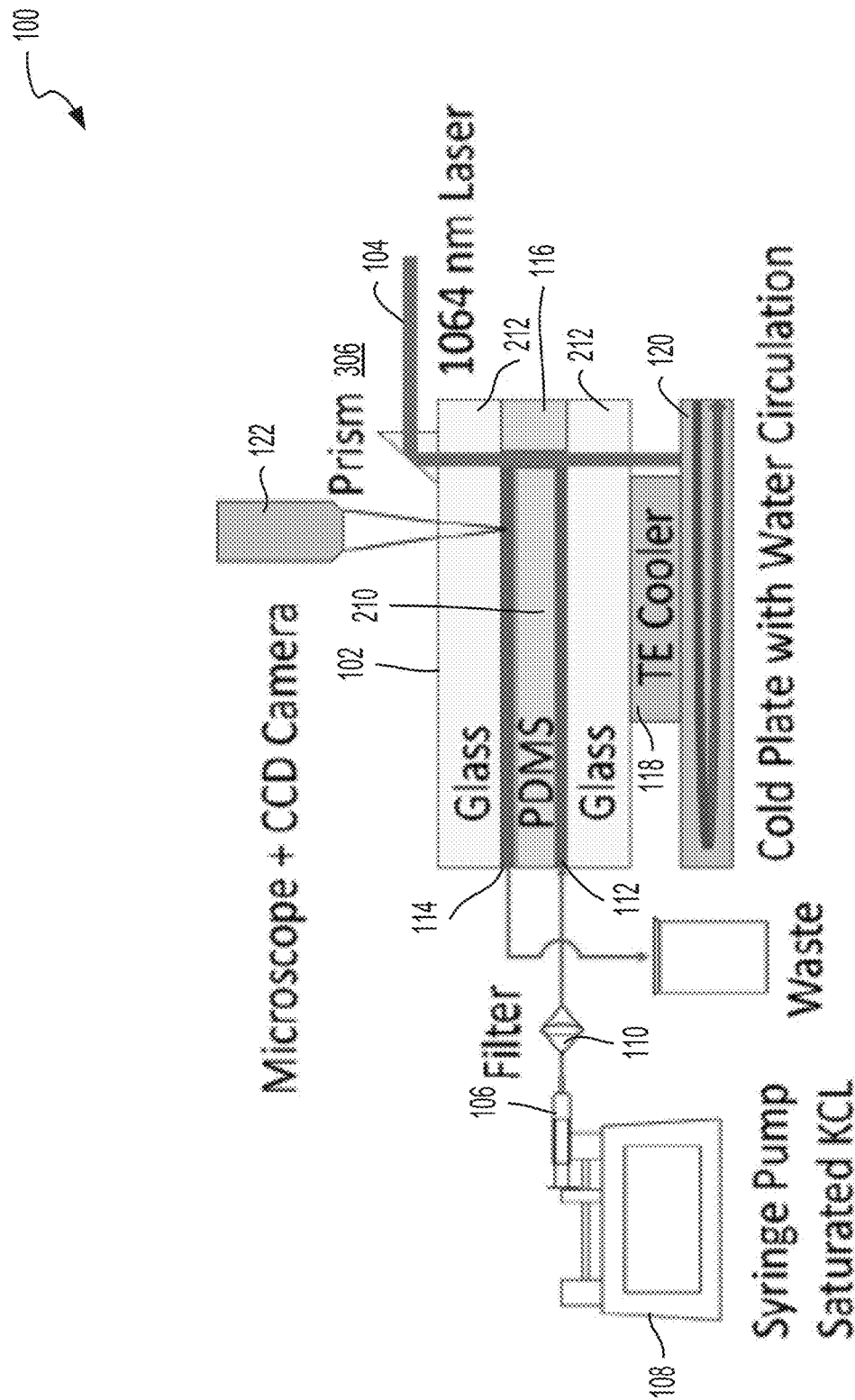
FIG. 1 illustrates an embodiment of a system for microfluidic nonphotochemical laser-induced nucleation.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Crystallization using batch-processing techniques can be used to concentrate and purify chemicals. However, these batch-processing techniques can face a number of challenges, such as imprecise control of the temperature profile of the batch solution. For batch solutions, heat transfer is typically driven by convective heat transfer where temperature gradients exit. Additionally, for batch solutions, it can be difficult to control the amount of fluid exposed to the laser because the fluid can diffuse or be transported away by convection. Batch crystallization methods can generate polydisperse crystal properties (e.g., size, morphology, polymorphs, number of crystals) compared to continuous-flow crystallizations.

In general, the systems and methods described in this application relate to laser-induced nucleation in continuous flow. A method of laser-induced nucleation in continuous flow includes injecting a saturated, undersaturated, or supersaturated solution through an inlet of a device. The method can include converting the saturated or undersaturated solution into supersaturated solution by changing the temperature of the saturated or undersaturated solution. The method can include passing one or more laser pulses through the supersaturated solution within the device. The method can include flowing the saturated, undersaturated, or supersaturated solution through an outlet of the device. In some embodiments, the method can include contacting the device with a thermoelectric cooler. The method can include characterizing, in situ, at least one of crystal size, shape, growth rate, polydispersity, number of crystals, and polymorphism. The method can include passing the solution through a filter. The method can control the manufacture of crystals of specific shape, growth kinetics, size, polydispersity, and polymorphs. In continuous flow, the laser and flow path can be designed to force exposure with precise control of the amount and time the liquid is exposed. In continuous flow, the amount of fluid that is not exposed to the laser can be tuned by changing the laser beam cross-section relative to the flow path cross-section. The use of two-dimensional flow can enable image analysis of particle characteristics, thus allowing for high-throughput screening applications based on, for example, machine learning and artificial intelligence. Additionally, continuous flow allows for the manipulation of multiphase flows exposed to the laser beam.

In some embodiments, the device can be a microfluidic device. The microfluidic device can be designed and fabricated for NPLIN in continuous laminar flow, which can enable real-time in situ characterization of crystal size, shape, growth rate, number of crystals, polydispersity, and polymorphism. On-chip thermoelectric cooling can create supersaturation by lowering the solution temperature. The influences of laser power density, laser exposure time, flow rate, and supersaturation can be examined for an aqueous KCl solution. The mean crystal size downstream from the irradiated region can be observed to increase with increasing supersaturation. The number of the crystals nucleated can be found to increase with increasing supersaturation and laser power density, but can be independent of the number of laser pulses to which the solution was exposed. These findings broaden the scope of nucleation in a light field by introducing a way to directly characterize the crystallization.

Referring to FIG. 1, a system for NPLIN in continuous flow is shown. The system can include a device. In the embodiments described in this application, the device is a microfluidic device. However, the present application is not limited in this regard. The device can be composed of materials that transmit laser light while maintaining intensity of the laser light. The device can be a microfluidic device 102. The system 100 includes a continuous flow device, such as a microfluidic device 102, and a laser setup 104. The system 100 can include a solution 106 (e.g. a saturated solution, a supersaturated solution, a KCl saturated solution, or a KCl supersaturated solution). The solution 106 including a KCl saturated solution can be prepared by dissolution of KCl in deionized water. The solution 106 can be loaded into a syringe and filtered. The solution 106 can be ultrasonicated in an ultrasonic cleaner. The solution 106 can be filtered into clean cylindrical glass vials with screw caps.

The solution 106 can be loaded in a syringe and injected into the microfluidic device 102 by way of a syringe pump 108. The syringe pump 108 can control the flow rate of the solution 106 into the microfluidic device 102. The solution 106 can pass through a filter 110 before entering the microfluidic device 102. The filter 110 can have a defined pore size (e.g., 0.2 p.m pore size). The solution 106 can pass through an inlet 112 of the microfluidic device 102. The solution 106 can exit through an outlet 114 of the microfluidic device 102. The solution 106 can pass through a nucleation zone 116. The solution 106 can interact with laser light in the nucleation zone 116. The microfluidic device 102 can contact a thermoelectric cooler 118 to promote uniform heat transfer. The thermoelectric cooler 118 can include a thermoelectric Peltier cooler. The microfluidic device 102 can contact the thermoelectric cooler 118 by way of a thermal paste. Heat generated on the hot side of the thermoelectric cooler 118 can be removed by a heat exchanger 120 using cold water circulation. The thermoelectric cooler 118 can be capable of stable sub-cooling with temperature fluctuations of less than 0.3 K. Heat transfer by the thermoelectric cooler 118 can be used to achieve a range of supersaturation of the solution 106. The heat transfer by the thermoelectric cooler 118 in continuous flow can be more precise than heat transfer in batch processing.

The laser setup 104 can include a system to generate laser pulses. The laser pulses can be of a defined duration (e.g. 6 nanoseconds) and wavelength (e.g., 1064 nm). The laser pulses can be generated by a Q-switched Nd:YAG laser. The pulse repetition rate of the laser can be 10 pulses per second (pps) or a submultiple of 10 pps. For example, the pulse repetition rate can be 10 pps, 2 pps, or a single shot). The laser beam of the laser pulse can be linearly polarized. The laser beam of the laser pulse can be linearly polarized using a Glan-Taylor polarizer, or any polarizer which can work effectively at higher laser powers without being damaged. Average power of the laser pulse can be measured with a power meter. Average power measurements can allow for the calculation of the peak power density. The continuous variation of the laser power density can be achieved by rotating a half-wave retardation plate. The laser can be matched with the geometry of the device. For example, the cross-section of the device can be designed to operate with the laser beam. The laser beam can also be circularly or elliptically polarized. The laser can also be at any wavelength that is not absorbed by the solution.

The crystallization of the solution 106 can be monitored by a camera mounted on a microscope 122. The camera can be connected to a 13-inch screen to provide an equivalent magnification of 145.6× and a resolution of 0.92 μm per pixel. The camera can be focused at a depth of 400 μm below the glass microscope slide 212 of the microfluidic device 102.

Figure 2:
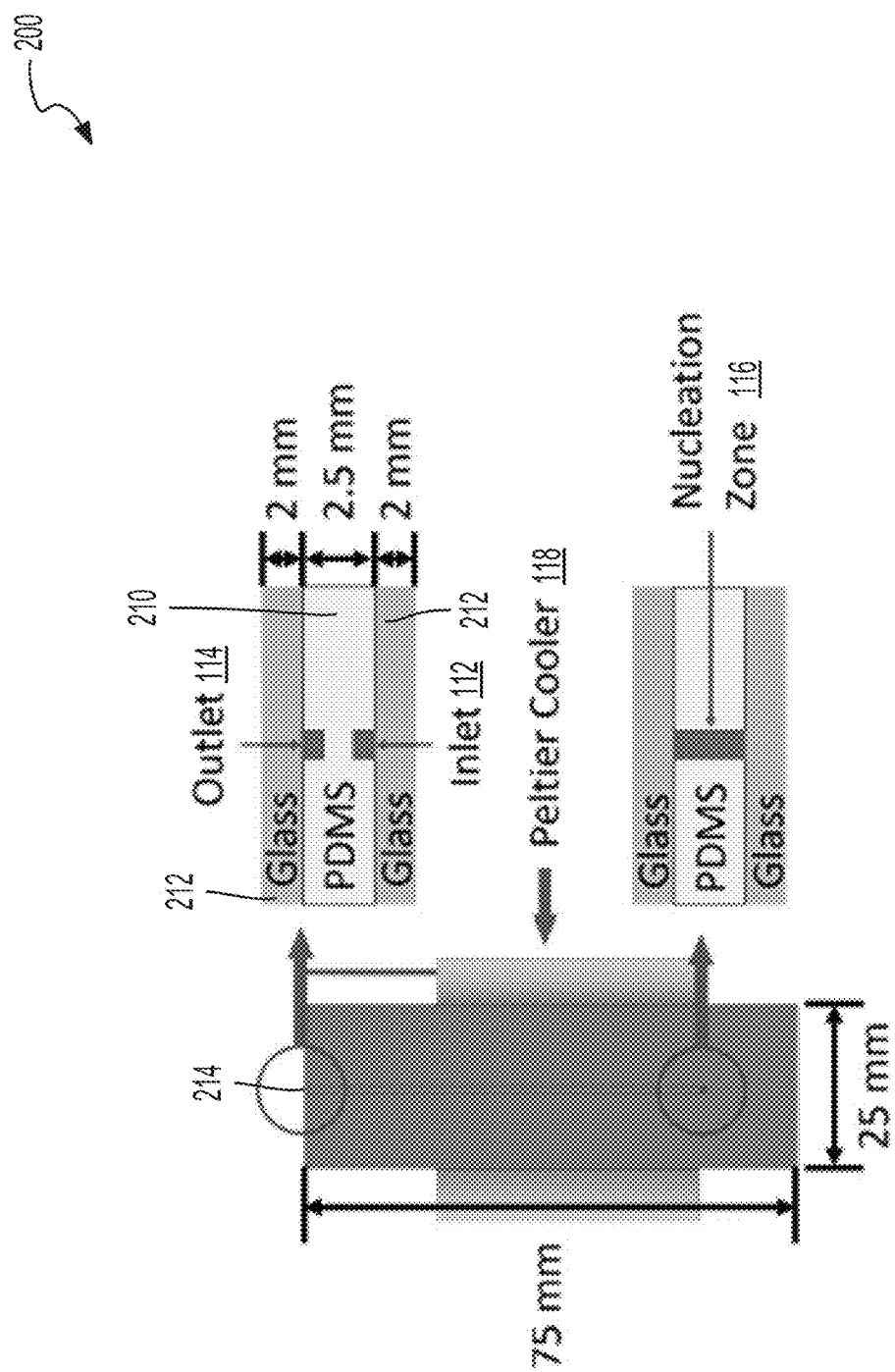
FIG. 2 illustrates an embodiment of a microfluidic system as shown in FIG. 1.

Referring to FIG. 2, a microfluidic system is shown. The microfluidic system 200 can include a microfluidic device 102. The microfluidic device 102 can include a polydimethylsiloxane (PDMS) layer 210 positioned between two solid surfaces, such as glass microscope slides 212, after a surface plasma treatment. The microfluidic device 102 can be composed of material that would allow transmission of the laser (e.g., glass, borosilicate, fused silica) and materials that the laser does not need to pass through (e.g., silicon, metal, silicon carbide, ceramics, polymers). The materials can operate over extended periods of time while being exposed to the laser. The polymers can include PDMS, fluorinated polymers, polycarbonate, PEEK, PTFE, PFA, FEP, Teflon®, Teflon® AF). The surface plasma treatment can include PDC-001-HP with Harrick Plasma. The PDMS layer 210 can be fabricated by curing Sylgard 184 in a 3D-printed mold. The microfluidic device 102 can have a length of 75 mm and a width of 25 mm. The microfluidic device 102 can have dimensions that enable laminar flow. The microfluidic device 102 can have dimensions that enable turbulent flow. Laminar flow and turbulent flow can be defined by the calculation of Reynolds numbers. For example, laminar flow can be defined by a Reynolds number of less than 2300. Turbulent flow can be defined by a Reynolds number of greater than 4000. The dimensions of the microfluidic device 102 can have dimensions that enable a flow in a transition regime. The transition regime can be defined by a Reynolds number of between 2300 and 4000. The device can have dimensions that depend on the desired (e.g., target) throughput or production rate. For example, the device can have dimensions that depend on a volume per time or mass per time. The microfluidic device 102 can include a channel 214. The channel 214 can have a cross-section of 1 mm×0.79 mm. The channel 214 can have a total length of 125 mm. The microfluidic device 102 can include a nucleation zone 116. The nucleation zone 116 can have a diameter of 1 mm. The solution 106 can interact with laser light in the nucleation zone 116. The microfluidic device 102 can have a volume of 99 μL. The microfluidic device 102 can be composed of materials that minimally or do not scatter light upon exposure to laser light. The inlet 112 can be located above the outlet 114. The inlet can allow the solution 106 to pass through the channel 214. The channel 214 can be disposed along the length of the microfluidic device 102. The channel 214 can define an axis that is perpendicular to an axis defined by the nucleation zone 116. The solution 106 can flow through the channel 214 along a fluid flow path that enters through the inlet 112 and exits through the outlet 114 of the microfluidic device 102.

Figure 3:
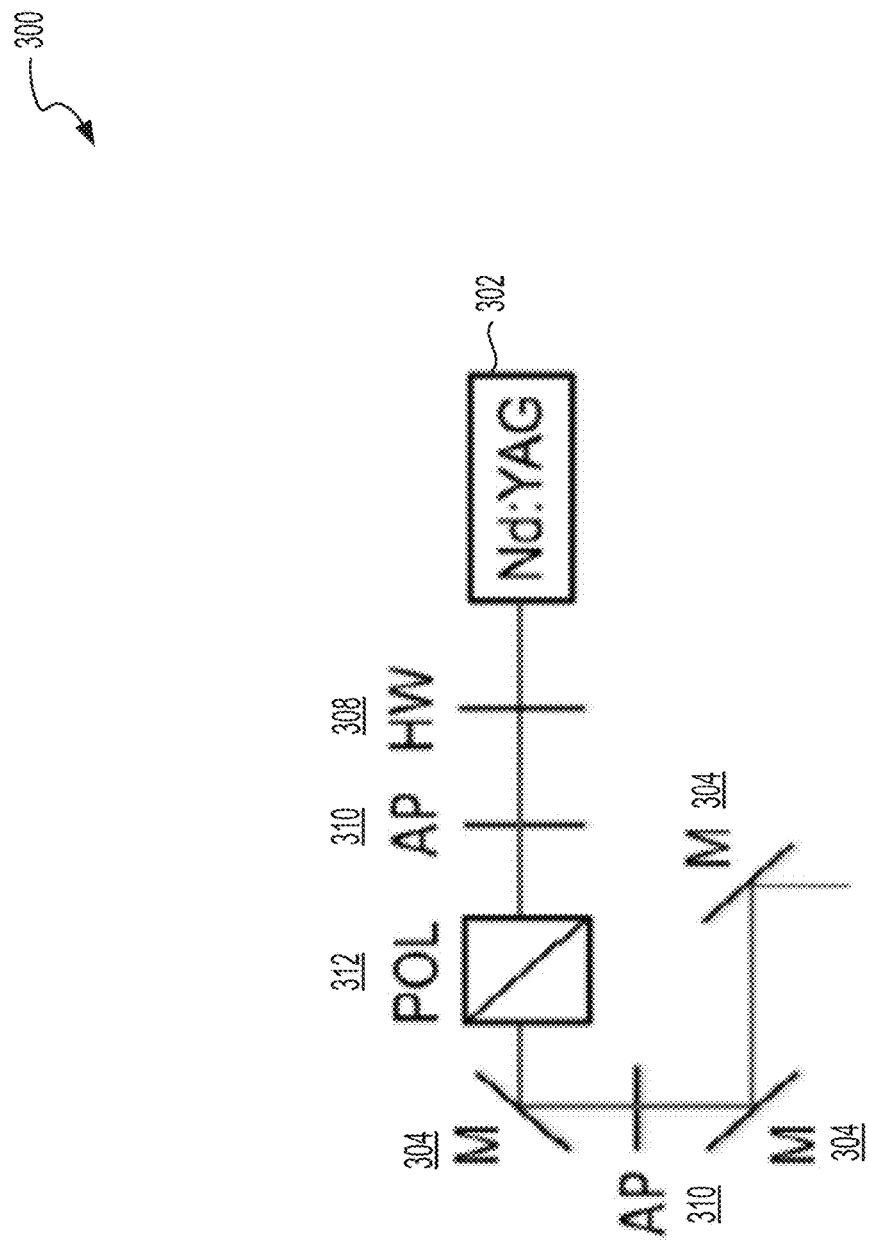
FIG. 3 illustrates an embodiment of a laser setup as shown in FIG. 1.

Referring to FIG. 3, a laser setup is shown. The laser setup 300 can include the laser setup 104. The laser setup 300 can include a laser 302. The laser 302 can be a Nd:YAG laser. The laser 302 can be aligned to cause NPLIN. The laser 302 can emit a train of 1064-nm light pulses that are directed into the nucleation zone 116 of the microfluidic device 102. The wavelength of the laser 302 can be a wavelength that is not absorbed by the solution 106. The wavelength of the laser 302 can be a wavelength that is not absorbed by a solute in the solution 106. For example, the wavelength of the laser 302 can be in visible light range. The wavelength of the laser 302 can be in the near infrared range. The direction of the light pulses can be controlled using mirrors 304 and a right angle prism 306. The intensity of the laser can be adjusted by rotating a half-wave plate 308. The diameter of the laser can be controlled using two circular ceramic apertures 310. The laser beam of the laser pulse can be linearly polarized. The laser beam of the laser pulse can be linearly polarized using a polarizer 312 (e.g., a Glan Taylor polarizer). The laser pulses can have a pulse duration. The pulse duration can range from milliseconds to femtoseconds. For example, the pulse duration can be nanoseconds (e.g. 6 nanoseconds).

Figure 4:
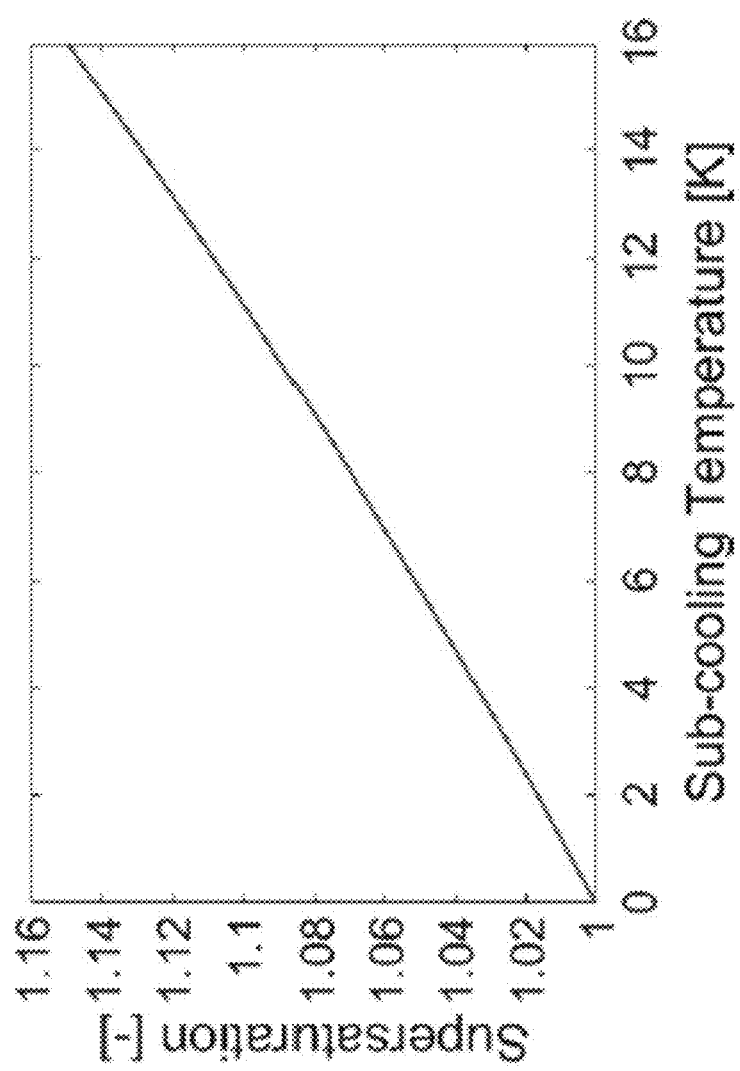
FIG. 4 illustrates an embodiment of a relationship between sub-cooling temperature and supersaturation.

Referring to FIG. 4, a relationship between sub-cooling temperature and supersaturation 400 is shown. For example, the sub-cooling temperature of supersaturated KCl solutions with supersaturations of 1.06, 1.08, and 1.10 were calculated. An increasing sub-cooling temperature is correlated with an increasing supersaturation. Microfluidics can allow for fast conductive heat transfer, thereby allowing for supersaturation to be achieved before the KCl solution reaches the nucleation zone at a flow rate of 200 μL/min.

Figure 5:
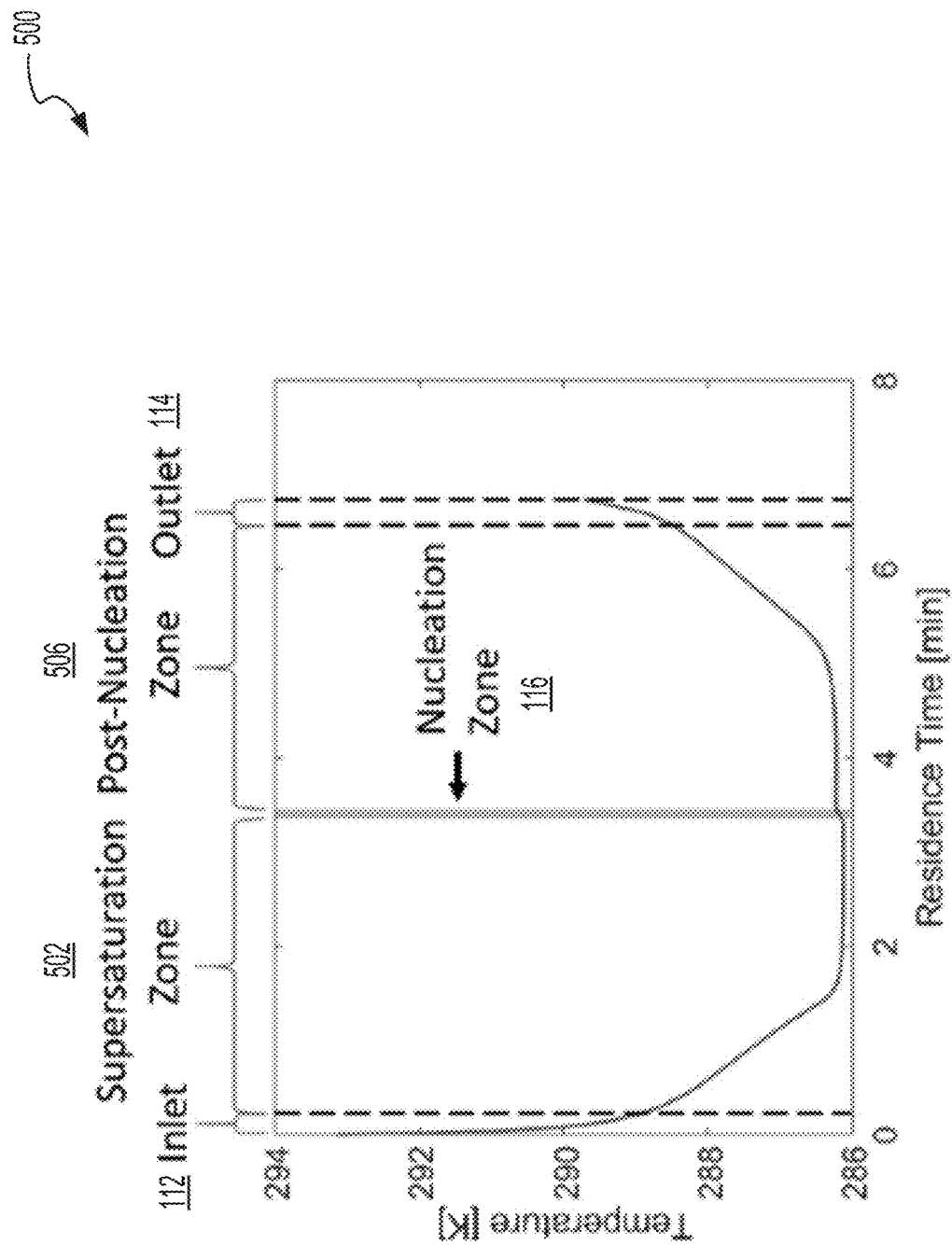
FIG. 5 illustrates an embodiment of a temperature profile along a channel of a microfluidic device.

Referring to FIG. 5, a temperature profile along a channel of a microfluidic device is shown. The microfluidic device 102 can be divided into five zones: inlet 112, supersaturation zone 502, nucleation zone 116, post-nucleation zone 506, and outlet 114. A stable temperature profile is created near the nucleation zone 116 with small temperature fluctuations of 0.1 K. The microfluidic device 102 can be designed such that the temperature of the microfluidic device 102 rises and supersaturation decreases while the solution 106 approaches the outlet 114. Therefore, further crystal growth can be inhibited and any potential clogging downstream can be avoided.

Figure 6:
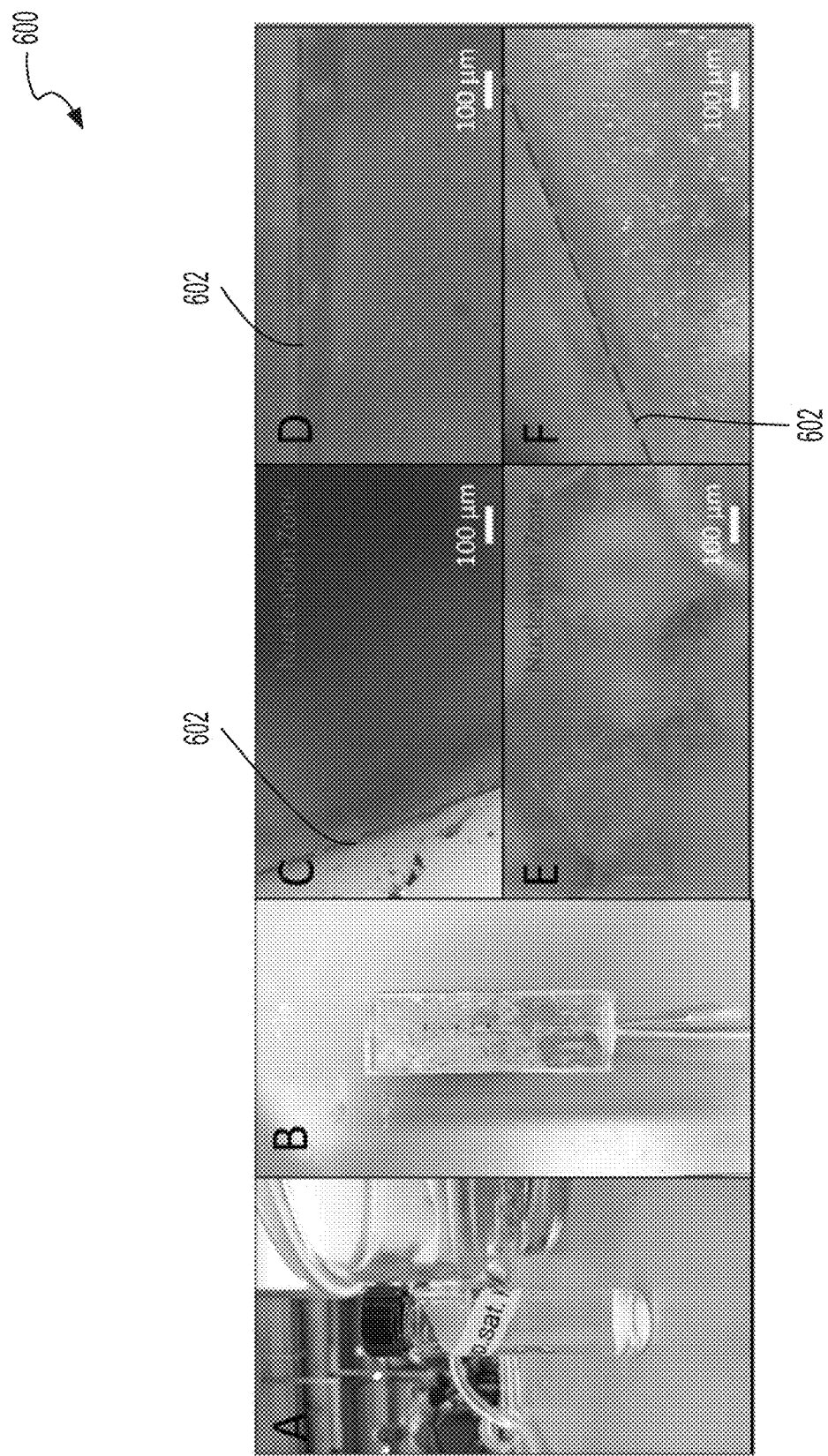
FIG. 6 illustrates an embodiment of a system for microfluidic nonphotochemical laser-induced nucleation.

Referring to FIG. 6, a system for microfluidic nonphotochemical laser-induced nucleation is shown. FIG. 6A shows a supersaturated KCl solution with supersaturation of 1.06 stirred for over 12 hours showing no trace of nucleation or crystals. FIG. 6B shows the microfluidic device 102. FIG. 6C shows a supersaturated KCl solution flowing through the nucleation zone 116 with no observed nucleation without laser irradiation. FIG. 6D shows a supersaturated KCl solution flowing through the channel 214 of the microfluidic device 102 with no observed crystals. FIG. 6E shows that, with laser irradiation at 200 MW/cm$^2$, crystal grew too large and too fast using a flow rate of 50 μm/min and clogged the nucleation zone 116. FIG. 6F shows that, with laser irradiation at 200 MW/cm$^2$, crystals were flowing through the channel 214 of the microfluidic device 102 at a flow rate of 200 μm/min. The channel walls 602 are shown in FIGS. 6C, 6D, and 6E.

Figure 7:
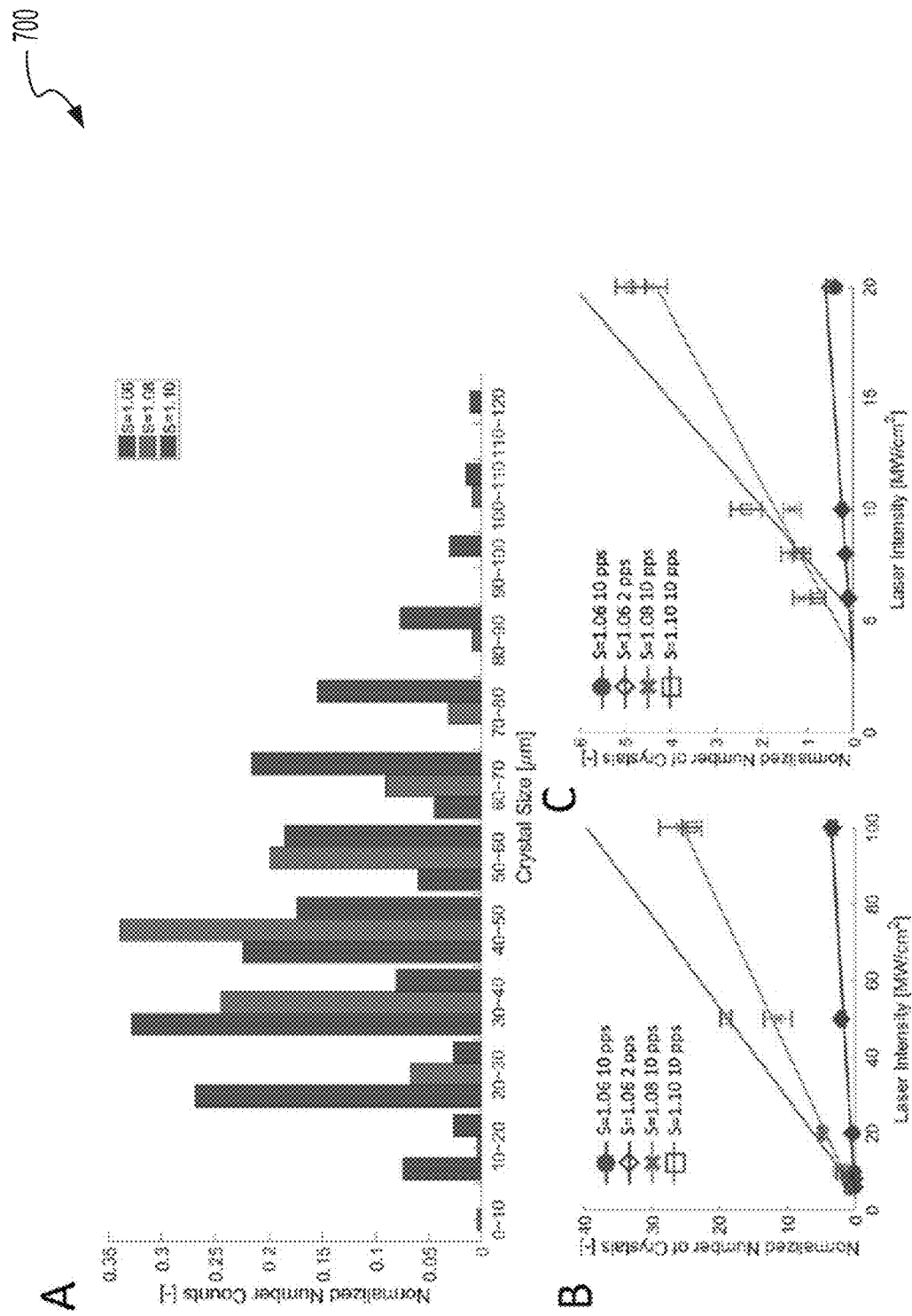
FIG. 7 illustrates an embodiment of a relationship between crystal size distribution and supersaturation, as well as the relationship between the number of crystals formed and the laser intensity.

Referring to FIG. 7, a relationship 700 between crystal size distribution and supersaturation is shown. FIG. 7A shows a plot of crystal size distribution vs. supersaturation, S of 1.06, 1.08, and, 1.10, incorporating data at all intensities. FIG. 7B shows a plot of number of crystals vs. laser power density at supersaturations of 1.06, 1.08, and 1.10. FIG. 7C shows a zoomed-in view of FIG. 7B at lower laser power density. Error bars represent standard deviations from averaging the results of three experiments at each intensity. Straight-line fits to the data are shown as solid lines for FIG. 7B and FIG. 7C. FIG. 7B shows a plot of the average number of crystals nucleated, $N_{crystal}$, vs. laser intensity, I, for different supersaturations and number of pulses. The experiments were carried out at a constant flow rate of 200 μL/min, so that irradiated solution volume is proportional to the flow time. The values of $N_{crystal}$ in FIG. 7B have been normalized to a flow time of 1 minute. The observed unimodal distribution of crystal sizes is evidence of the absence of secondary nucleation. The number of crystals formed is approximately proportional to the laser intensity, but with an offset owing to the intensity threshold. The best linear fits are included for FIG. 7B and FIG. 7C.

The laser-induced nucleation experimental results under different supersaturations, laser intensities and laser pulse repetition rates are reported in Table 1. Details of $N_{crystal}$ and the normalization method are shown in Table 1 where the video time is the residence time.

TABLE 1

Laser-induced nucleation experimental results under different supersaturations, laser intensities and laser pulse repetition rates.

| Supersaturation/laser pulse frequency (pps) | | | | | | | |
|---|---|---|---|---|---|---|---|
| 1.06/10 | 100 | 50 | 20 | 10 | 8 | 6 | Laser power density (MW/cm$^2$) |
| | 19 | 10 | 6 | 4 | 3 | 2 | Run 1 — Number of |
| | 16 | 10 | 6 | 3 | 3 | 3 | Run 2 — crystals |
| | 17 | 11 | 5 | 4 | 4 | 2 | Run 3 — observed |
| | 5 | 5 | 15 | 15 | 20 | 20 | Video time (min) |
| | 1.0 | 1.0 | 3.0 | 3.0 | 4.0 | 4.0 | Solution volume irradiated (mL) |
| | 3.27 | 2.07 | 0.38 | 0.24 | 0.17 | 0.12 | Average number of crystals normalized to 1 min |
| | 0.25 | 0.09 | 0.03 | 0.03 | 0.02 | 0.02 | Standard deviation |
| 1.08/10 | 100 | 50 | 20 | 10 | 8 | 6 | Laser power density (MW/cm$^2$) |
| | 23 | 9 | 21 | 6 | 5 | 5 | Run 1 — Number of |
| | 24 | 14 | 21 | 8 | 8 | 5 | Run 2 — crystals |
| | 30 | 11 | 25 | 6 | 7 | 7 | Run 3 — observed |
| | 1 | 1 | 5 | 5 | 5 | 5 | Video time (min) |
| | 0.2 | 0.2 | 1.0 | 1.0 | 1.0 | 1.0 | Solution volume irradiated (mL) |
| | 25.7 | 11.3 | 4.47 | 1.33 | 1.33 | 1.13 | Average number of crystals normalized to 1 min |
| | 3.1 | 2.0 | 0.38 | 0.19 | 0.25 | 0.19 | Standard deviation |
| 1.10/10 | 100 | 50 | 20 | 10 | 8 | 6 | Laser power density (MW/cm$^2$) |
| | 23 | 19 | 14 | 14 | 5 | 11 | Run 1 — Number of |
| | 26 | 20 | 14 | 10 | 7 | 15 | Run 2 — crystals |
| | 23 | 18 | 16 | 11 | 5 | 9 | Run 3 — observed |
| | 1 | 1 | 3 | 5 | 5 | 15 | Video time (min) |
| | 0.2 | 0.2 | 0.6 | 1.0 | 1.0 | 3.0 | Solution volume irradiated (mL) |
| | 24.0 | 19.0 | 4.89 | 2.33 | 1.13 | 0.78 | Average number of crystals normalized to 1 min |
| | 1.4 | 0.8 | 0.31 | 0.34 | 0.19 | 0.17 | Standard deviation |
| 1.06/2 | 100 | 50 | 20 | 10 | 8 | 6 | Laser power density (MW/cm$^2$) |
| | 17 | 7 | 9 | 5 | 3 | 2 | Run 1 — Number of |
| | 13 | 10 | 6 | 3 | 4 | 1 | Run 2 — crystals |
| | 20 | 13 | 8 | 3 | 3 | 3 | Run 3 — observed |
| | 5 | 5 | 15 | 15 | 20 | 20 | Video time (min) |
| | 1.0 | 1.0 | 3.0 | 3.0 | 4.0 | 4.0 | Solution volume irradiated (mL) |
| | 3.33 | 2.00 | 0.51 | 0.24 | 0.17 | 0.10 | Average number of crystals normalized to 1 min |
| | 0.57 | 0.49 | 0.08 | 0.06 | 0.02 | 0.04 | Standard deviation |

The threshold power densities for NPLIN are reported in Table 2. The fitted parameters at different supersaturations and laser repetition rates using $N_{crystal}=m(I-I_{th})$.

TABLE 2

Threshold power densities for NPLIN

| Super-saturation | Laser repetition rate [pps] | m[cm²/MW] | $I_{th}$[MW/cm²] |
|---|---|---|---|
| 1.06 | 2 | 0.036 ± 0.005 | 2.5 ± 5.9 |
| 1.06 | 10 | 0.037 ± 0.006 | 3.5 ± 6.6 |
| 1.08 | 10 | 0.262 ± 0.015 | 3.6 ± 2.5 |
| 1.10 | 10 | 0.417 ± 0.053 | 5.3 ± 2.7 |

Figure 8:
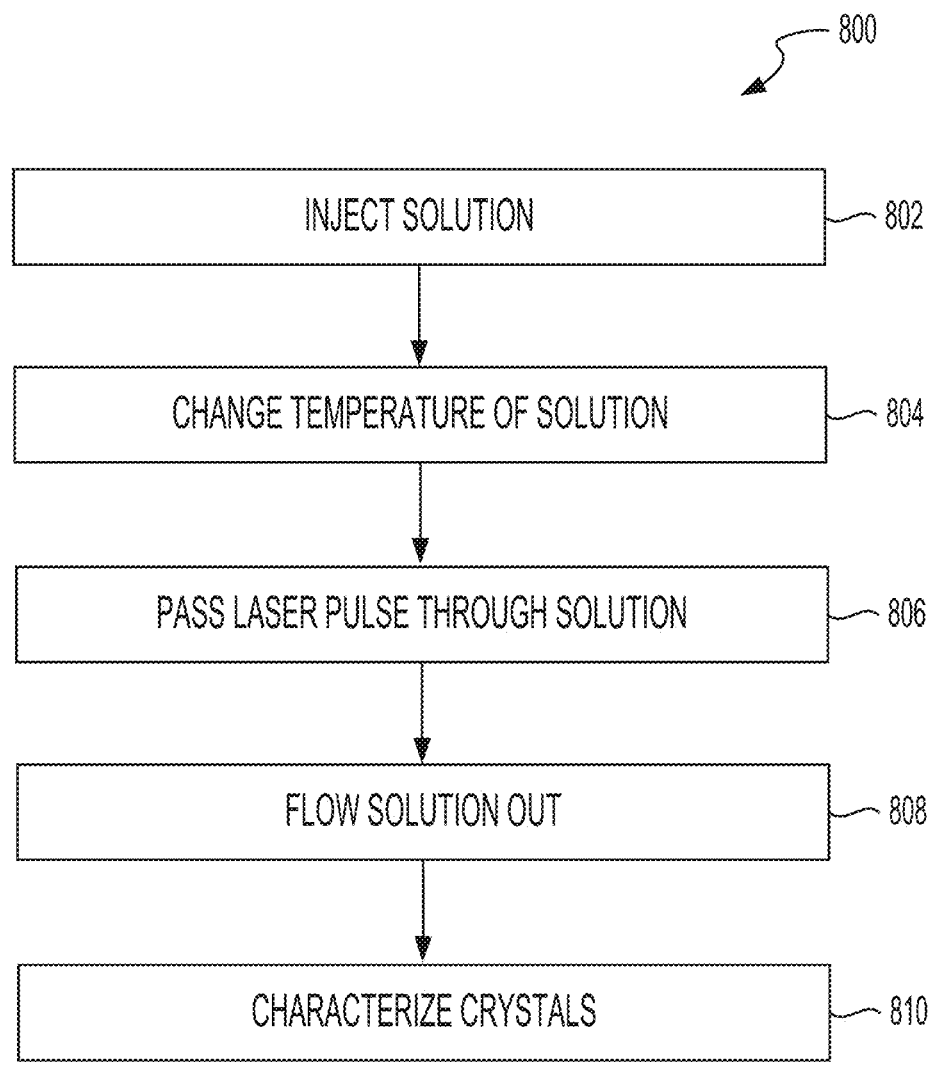
FIG. 8 illustrates a method for laser-induced nucleation in continuous flow according to an embodiment.

FIG. 8 illustrates a method for laser-induced nucleation in continuous flow according to an embodiment. In brief overview, the method 800 may include injecting a solution through an inlet of a device (BLOCK 802). The method 800 may include converting the saturated or undersaturated solution into supersaturated solution (BLOCK 804). The method 800 may include passing one or more laser pulses through the supersaturated solution (BLOCK 806). The method 800 may include flowing the solution through an outlet of the device (BLOCK 808). The method 800 may include characterizing the resulting crystals (BLOCK 810).

The method 800 may include injecting a solution through an inlet of a device (BLOCK 802). The solution can be a saturated solution, undersaturated solution, or a supersaturated solution. The device can be a microfluidic device. The solution can pass through an inlet of the microfluidic device. The inlet may be located above the outlet. The inlet may be located below the outlet. The device can be operated at extreme temperatures. For example, the device can be operated at a temperature above 0 K. The device can be operated at cryogenic temperatures. The device can be operated at temperatures hundreds of degrees above ambient temperature (e.g., 100° C., 200° C., 300° C., 400° C., 500° C.). The device can be operated at high pressures (e.g., 10 bar, 50 bar, 100 bar, 200 bar, 500 bar). The device can be operated at pressures below, above, or at 1 bar. The method can include injecting a flow through an inlet of the device. The flow can include a single phase flow. For example, the flow can include a liquid, gas, supercritical fluid, or any combinations thereof. The flow can include a multiphase flow. For example, the multiphase flow can include a two-phase flow (e.g., gas-liquid flow, gas-solid flow, liquid-liquid flow, liquid-solid flow). The multiphase flow can include a three-phase flow (e.g., gas-liquid-solid flow, gas-liquid-liquid flow, solid-liquid-liquid flow).

The method 800 may include converting the saturated or undersaturated solution into supersaturated solution (BLOCK 804). The method can include converting the saturated or undersaturated solution into supersaturated solution by changing a temperature of the saturated or undersaturated solution. For example, the method can include using a thermoelectric cooler to convert the saturated or undersaturated solution into supersaturated solution. The method can include causing a temperature change by a thermoelectric cooler.

The method 800 may include passing one or more laser pulses through the supersaturated solution (BLOCK 806). The laser pulses can be generated by a Q-switched Nd:YAG laser. The pulse repetition rate of the laser can be 10 pulses per second (pps) or a submultiple of 10 pps. For example, the pulse repetition rate can be 10 pps, 2 pps, or a single shot). The pulsed laser beam can be linearly polarized, circularly polarized, or elliptically polarized. The laser beam of the laser pulse can be linearly polarized using a Glan Taylor polarizer. A quarter wave plate can be used to transform a linearly polarized beam into a circularly or elliptically polarized beam. Average power of the laser pulse can be measured with a Coherent LM30V power meter. Average power measurements can allow for the calculation of the peak power density. The continuous variation of the laser power density can be achieved by rotating a half-wave retardation plate.

The method 800 may include flowing the saturated, undersaturated, or supersaturated solution out of a device (BLOCK 808). The method can include flowing the solution through an outlet of the device. The device can include a microfluidic device. The solution can exit through an outlet of the microfluidic device. The outlet may be located below the inlet 112. The outlet may be located above the inlet, or the outlet and inlet may be side-by-side. The device can handle crystals or solids.

The method 800 may include characterizing the resulting crystals (BLOCK 810). The method 800 can include imaging the resulting crystals. The method 800 can include characterizing the resulting crystals before flowing the solution through an outlet of the device. The method 800 can include imaging the resulting crystals before flowing the solution through an outlet of the device. The method 800 can include characterizing the resulting crystals after flowing the solution through an outlet of the device. The method 800 can include imaging the resulting crystals after flowing the solution through an outlet of the device.

In some embodiments, the method 800 can include nucleating crystals. Nucleating crystals can be responsive to passing the one or more laser pulses through the supersaturated solution within the device. The method can include nucleating crystals from the supersaturated solution. The method can include collecting the crystals from the device. The method can include nucleating crystals from the supersaturated solution formed by a reaction (e.g., Heck Reaction, Suzuki Reaction, or Buchwald-Hartwig amination). The method can include nucleating crystals from the supersaturated solution resulting from a chemical reaction such as the Heck Reaction, Suzuki Reaction, or Buchwald-Hartwig amination, or any chemical reaction carried out under conditions that result in the formation of crystalline products or byproducts.

In some embodiments, the method can improve solids handling in continuous flow. The method can include selectively inducing the nucleation of crystals in the bulk flowing fluid instead of on equipment or catalyst surfaces. For example, the nucleation can include homogeneous nucleation as opposed to heterogeneous nucleation. The method can include nucleating crystals that flow through equipment or catalysts without any solids accumulation that may result from their flocculation, aggregation, deposition, hydrodynamic bridging, inertial impaction, dendrite formation, or heterogeneous nucleation.

Figure 9:
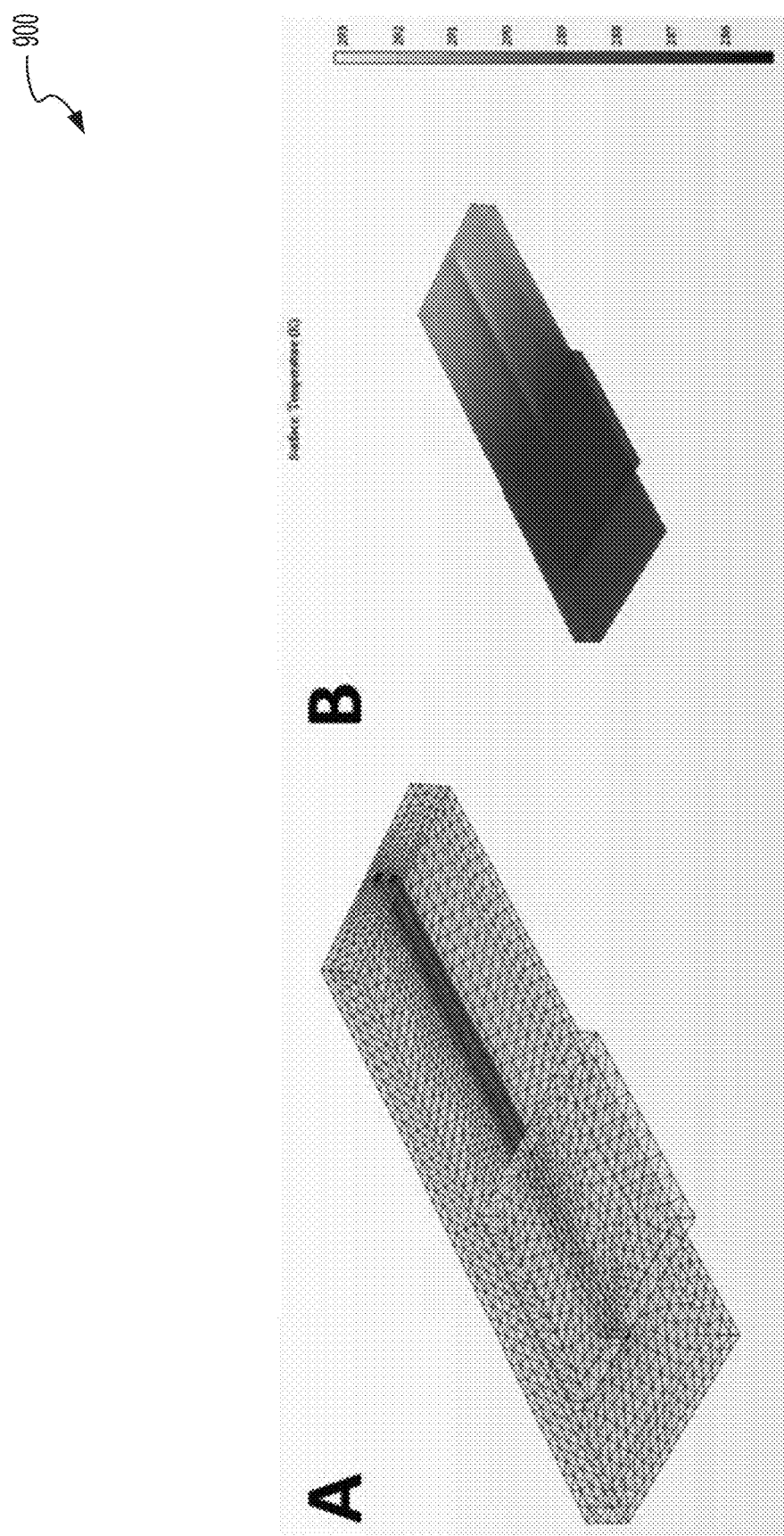
FIG. 9 illustrates an embodiment of computational fluid dynamics calculations of the microfluidic system.

Referring to FIG. 9, an embodiment of computational fluid dynamics (CFD) modeling 900 of the microfluidic system is shown. In an embodiment, the CFD simulation was carried out using COMSOL Multiphysics® version 5.3 (Build: 316). Geometries were created with dimensions identical to those of the actual microfluidic device 102 and thermoelectric cooler 118. Corning 7740 (Pyrex), water, structural steel, and PDMS were assigned as material to the glass layer, fluid, cooler, and middle layer, respectively. A relative tolerance of 0.001 was used in stationary studies. The microfluidic device body and cooler used a normalsized mesh while the fluid used a finer mesh calibrated for fluid dynamics calculation. FIG. 9A shows the mesh used in the CFD calculations. FIG. 9B shows the temperature field simulation results.

Figure 10:
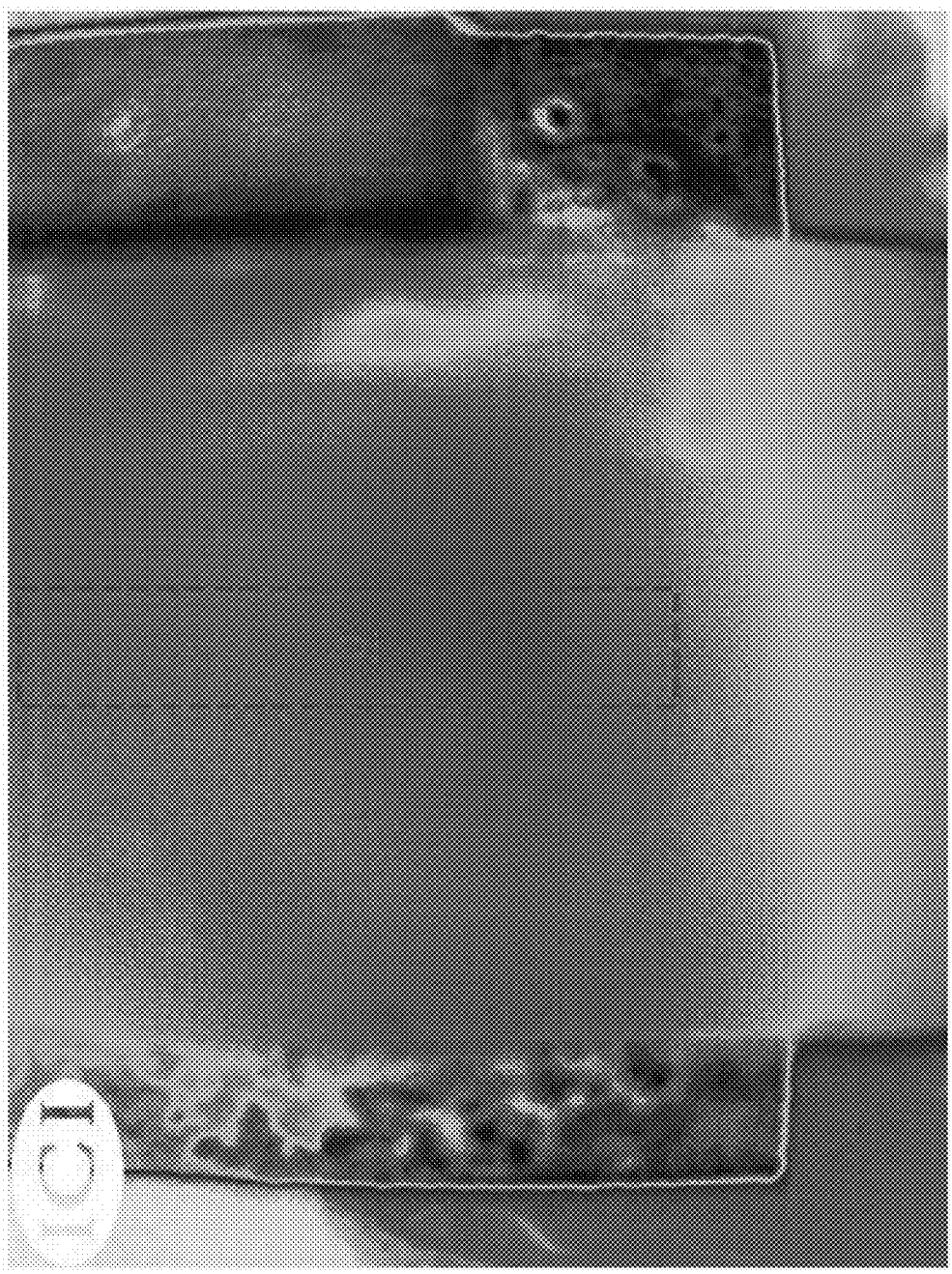
FIG. 10 illustrates an embodiment of a temperature map of the microfluidic system.

Referring to FIG. 10, an embodiment of a temperature map 1000 of the microfluidic system is shown. The thermocouple (zone a) has an average temperature of 12.08±0.34° C. The microfluidic device 102 surface above the channel (zone b) has an average temperature of 12.29±0.44° C. The temperature map was measured using an infrared camera (ICI P9000).

Figure 11:
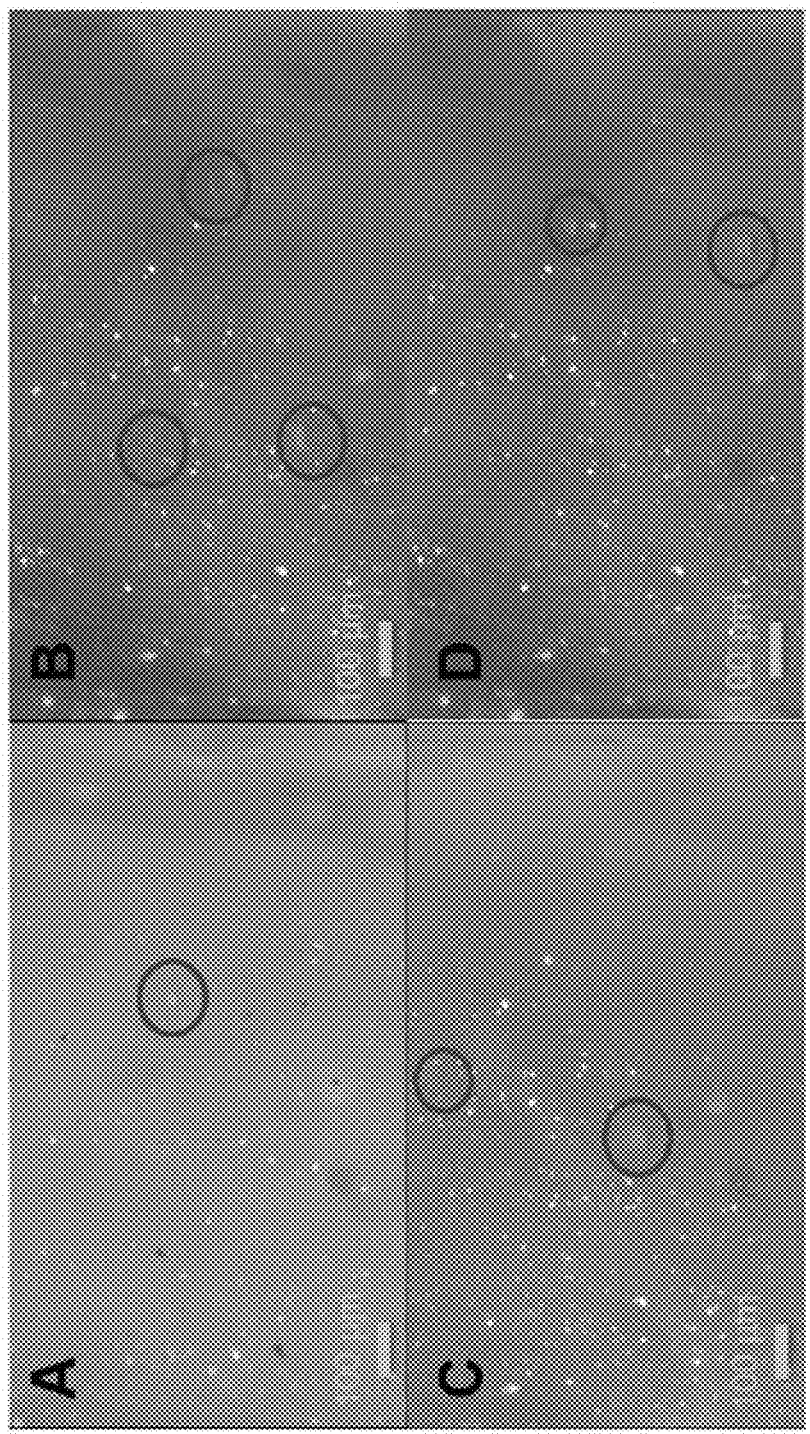
FIG. 11 illustrates an embodiment of images of crystals captured by microscopy.

Referring to FIG. 11, an embodiment of plots of crystals captured by microscopy 1100 is shown. Plots of crystals captured by real-time optical microscopy are shown. FIG. 11A shows supersaturation, S=1.06 and 100 MW/cm$^2$. FIG. 11B shows supersaturation, S=1.08 and 100 MW/cm$^2$. FIG. 11C shows supersaturation, S=1.08 and 40 MW/cm$^2$. FIG. 11D shows supersaturation, S=1.10 and 100 MW/cm$^2$. Crystals formed were discrete and of cubic or cuboid shape.

Figure 12:
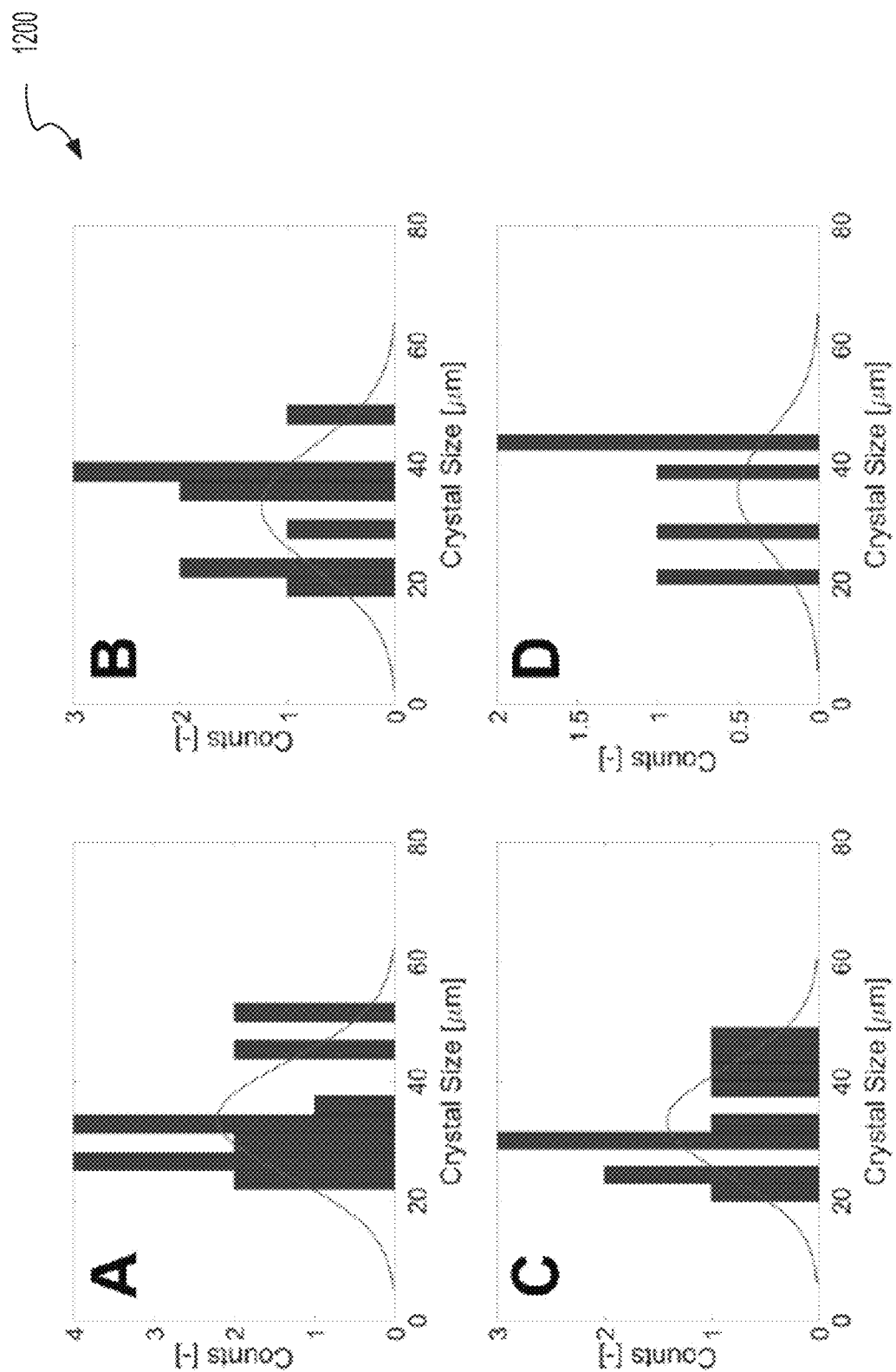
FIG. 12 illustrates an embodiment of plots of crystal size distribution.

Referring to FIG. 12, an embodiment of plots of crystal size distribution 1200 is shown. Plots of crystal size distribution at 1.06 supersaturation are shown. FIG. 12A shows a plot of crystal size distribution at 100 MW/cm$^2$ and 5 minutes. FIG. 12B shows a plot of crystal size distribution at 50 MW/cm$^2$ and 5 minutes. FIG. 12C shows a plot of crystal size distribution at 20 MW/cm$^2$ and 15 minutes. FIG. 12D shows a plot of crystal size distribution at 10 MW/cm$^2$ and 15 minutes.

Implementations described in this specification can be implemented in digital electronic circuitry, or in computer software, firmware, or hardware, including the structures disclosed in this specification and their structural equivalents, or in combinations of one or more of them. The implementations described in this specification can be implemented as one or more computer programs, i.e., one or more modules of computer program instructions, encoded on one or more computer storage media for execution by, or to control the operation of, data processing apparatus. Alternatively, or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device or substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium is both tangible and non-transitory.

Figure 13:
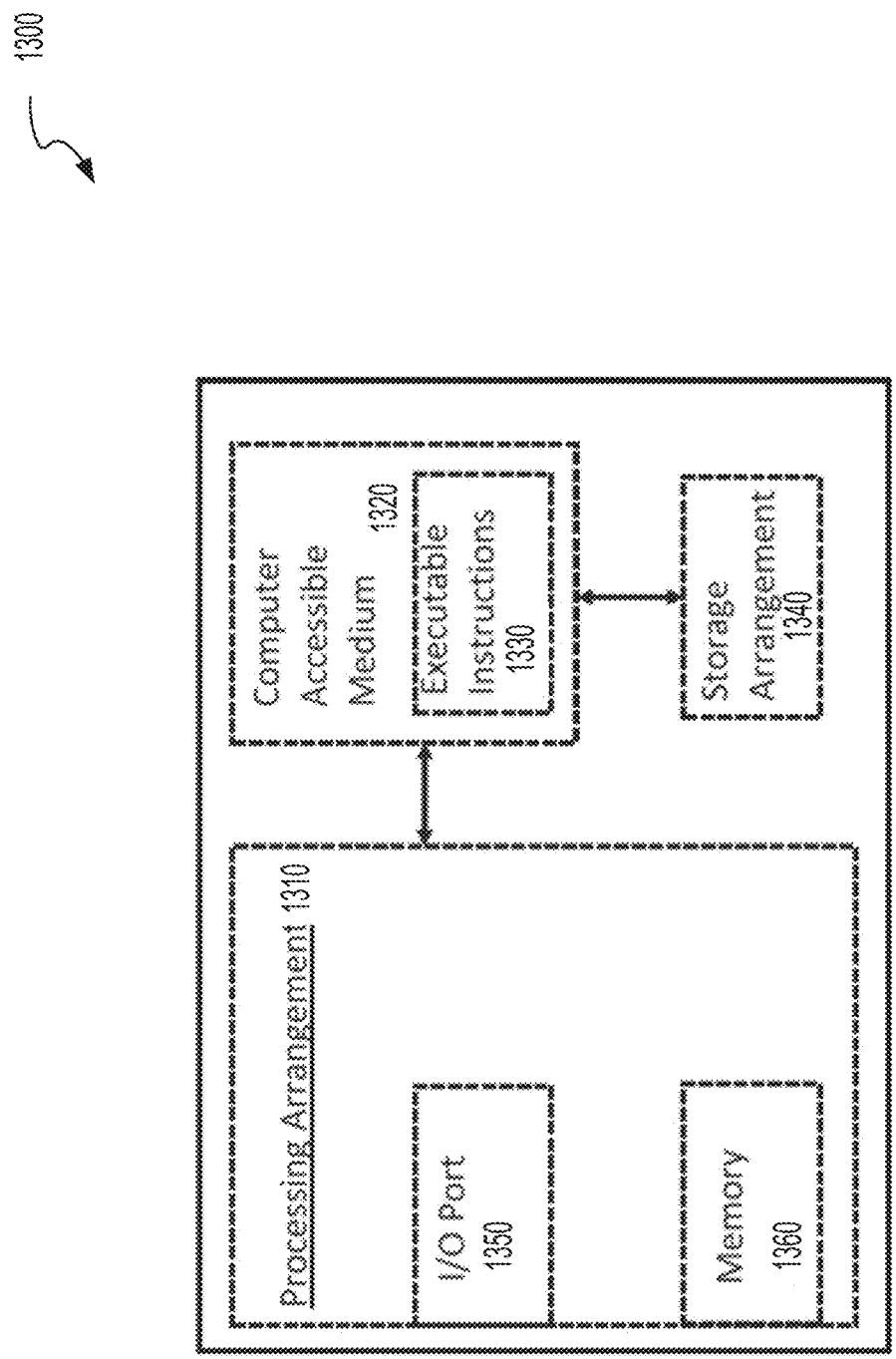
FIG. 13 illustrates an embodiment of a computer system for implementing an embodiment of the methods described herein.

As shown in FIG. 13, e.g., a computer-accessible medium 1320 (e.g., as described herein, a storage device such as a hard disk, floppy disk, memory stick, CD-ROM, RAM, ROM, etc., or a collection thereof) can be provided (e.g., in communication with the processing arrangement 1310). The computer-accessible medium 1320 may be a non-transitory computer-accessible medium. The computer-accessible medium 1320 can contain executable instructions 1330 thereon. In addition or alternatively, a storage arrangement 1340 can be provided separately from the computer-accessible medium 1320, which can provide the instructions to the processing arrangement 1310 so as to configure the processing arrangement to execute certain exemplary procedures, processes and methods, as described herein, for example. The computer-accessible medium 1320 can contain memory 1360, which can provide storage for information. The computer-accessible medium 1320 can contain an I/O port 1350, which can provide an interface between the computer-accessible medium 1320 and other devices. The instructions may include a plurality of sets of instructions.

System 100 may also include a display or output device, an input device such as a key-board, mouse, touch screen or other input device, and may be connected to additional systems via a logical network. Many of the embodiments described herein may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Those skilled in the art can appreciate that such network computing environments can typically encompass many types of computer system configurations, including personal computers, hand-held devices, multi-processor systems, microprocessor-based or programmable consumer electronics, network PCs, mini-computers, mainframe computers, and the like. Embodiments of the invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

Various embodiments are described in the general context of method steps, which may be implemented in one embodiment by a program product including computer-executable instructions, such as program code, executed by computers in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present invention could be accomplished with standard programming techniques with rule based logic and other logic to accomplish the various database searching steps, correlation steps, comparison steps and decision steps. It should also be noted that the words "component" and "module," as used herein and in the claims, are intended to encompass implementations using one or more lines of software code, and/or hardware implementations, and/or equipment for receiving manual inputs.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Thus, particular implementations of the invention have been described.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. Therefore, the above embodiments should not be taken as limiting the scope of the invention.

What is claimed is:

1. A method of laser-induced nucleation in continuous flow, comprising:
   injecting at least one of a saturated solution, an undersaturated solution, or a supersaturated solution through an inlet of a device;
   if an undersaturated solution or a saturated solution were injected, converting the saturated solution or the undersaturated solution into supersaturated solution by changing a temperature of the saturated or the undersaturated solution;
   passing one or more laser pulses through a flowing fluid comprising the supersaturated solution within the device; and
   flowing the supersaturated solution through an outlet of the device.

2. The method of claim 1, comprising:
   nucleating crystals, responsive to passing one or more laser pulses through the supersaturated solution within the device, from the supersaturated solution; and
   collecting the crystals from the device.

3. The method of claim 1, comprising:
   contacting the device with a thermoelectric cooler.

4. The method of claim 1, comprising:
   characterizing, in situ, at least one of crystal size, shape, growth rate, number of crystals, polydispersity, or polymorphism.

5. The method of claim 1, comprising:
   passing the least one of the saturated solution, undersaturated solution, or supersaturated solution through a filter.

6. The method of claim 1, comprising:
   operating the device at a pressure above 1 bar.

7. The method of claim 1, comprising:
   nucleating crystals from the supersaturated solution resulting from a chemical reaction comprising at least one of the Heck Reaction, Suzuki Reaction, or Buchwald-Hartwig amination, or any chemical reaction carried out under conditions that result in the formation of crystalline products or byproducts.

8. The method of claim 7, comprising:
   improvement of solids handling by selectively inducing nucleation in bulk flow instead of on equipment or catalyst surfaces.

9. A method of laser-induced nucleation in continuous flow, comprising:
   providing a device;
   injecting a fluid through an inlet of the device;
   passing one or more laser pulses through flowing fluid within the device; and
   flowing the fluid through an outlet of the device.

10. The method of claim 9, wherein the flowing fluid is a single phase flow.

11. The method of claim 9, wherein the flowing fluid is a multiphase flow.

12. The method of claim 9, comprising:
    nucleating crystals, responsive to passing one or more laser pulses through the flowing fluid within the device, from a supersaturated solution; and
    collecting the crystals from the device.

13. The method of claim 9, comprising:
    contacting the device with a thermoelectric cooler.

14. The method of claim 9, comprising:
    characterizing, in situ, at least one of crystal size, shape, growth rate, number of crystals, polydispersity, or polymorphism.

15. The method of claim 9, comprising:
    passing a fluid comprising at least one of a saturated solution, undersaturated solution, or supersaturated solution through a filter.

16. The method of claim 9, comprising:
    operating the device at a pressure above 1 bar.

17. The method of claim 9, comprising:
    nucleating crystals from a supersaturated solution resulting from a chemical reaction comprising at least one of the Heck Reaction, Suzuki Reaction, or Buchwald-Hartwig amination, or any chemical reaction carried out under conditions that result in the formation of crystalline products or byproducts.

18. The method of claim 9, comprising:
    inducing nucleation in bulk flow instead of on equipment or catalyst surfaces.

* * * * *